United States Patent [19]

Yagi et al.

[11] Patent Number: 4,593,462
[45] Date of Patent: Jun. 10, 1986

[54] APPARATUS FOR AUTOMATICALLY MOUNTING CHIP-TYPE CIRCUIT ELEMENTS ON SUBSTRATE

[75] Inventors: Hiroshi Yagi; Hisashi Fujita; Kotaro Harigane, all of Nihonbashi, Japan

[73] Assignee: TDK Corporation, Tokyo, Japan

[21] Appl. No.: 751,034

[22] Filed: Jul. 1, 1985

[30] Foreign Application Priority Data

| Sep. 24, 1984 | [JP] | Japan | 59-199309 |
| Feb. 19, 1985 | [JP] | Japan | 60-32481 |
| Feb. 19, 1985 | [JP] | Japan | 60-32482 |
| Feb. 19, 1985 | [JP] | Japan | 60-32483 |
| Feb. 19, 1985 | [JP] | Japan | 60-32484 |
| Feb. 19, 1985 | [JP] | Japan | 60-32485 |

[51] Int. Cl.⁴ .................. H05K 3/00; H05K 1/00; H05K 3/30
[52] U.S. Cl. .................. 29/740; 29/417; 29/832; 29/593
[58] Field of Search .................. 29/740, 729, 739, 741, 29/742, 743, 759, DIG. 44, 593, 831, 832, 834

[56] References Cited

U.S. PATENT DOCUMENTS

| 3,473,212 | 10/1969 | Beck et al. | 29/740 |
| 3,499,203 | 3/1970 | Clark et al. | 29/740 |
| 3,499,204 | 3/1970 | Drop | 29/740 |
| 4,135,630 | 1/1979 | Snyder et al. | 29/740 |
| 4,151,945 | 5/1979 | Ragard et al. | 29/740 |
| 4,372,802 | 2/1983 | Harigane et al. | 29/740 |
| 4,473,247 | 9/1984 | Itemadani et al. | 29/740 |

*Primary Examiner*—Mark Rosenbaum
*Assistant Examiner*—Irene Golabi
*Attorney, Agent, or Firm*—Frishauf, Holtz, Goodman & Woodward

[57] ABSTRACT

An apparatus for automatically mounting chip-type circuit elements on a substrate for a printed circuit board is disclosed which is capable of overcoming the problem of suction failure and wrong posture of a circuit element to efficiently carry out the mounting operation of the elements on a substrate. The automatic mounting apparatus includes a detecting device for detecting a defect such as a failure in suction of a circuit element by a mounting head and/or the wrong posture of a circuit element sucked up and a rotating disk controllably actuated to allow a mounting head other than that relating to the defect to suck up a circuit element of the same kind from tape feeders and mount it on the substrate after the detecting device detects the defect.

9 Claims, 35 Drawing Figures

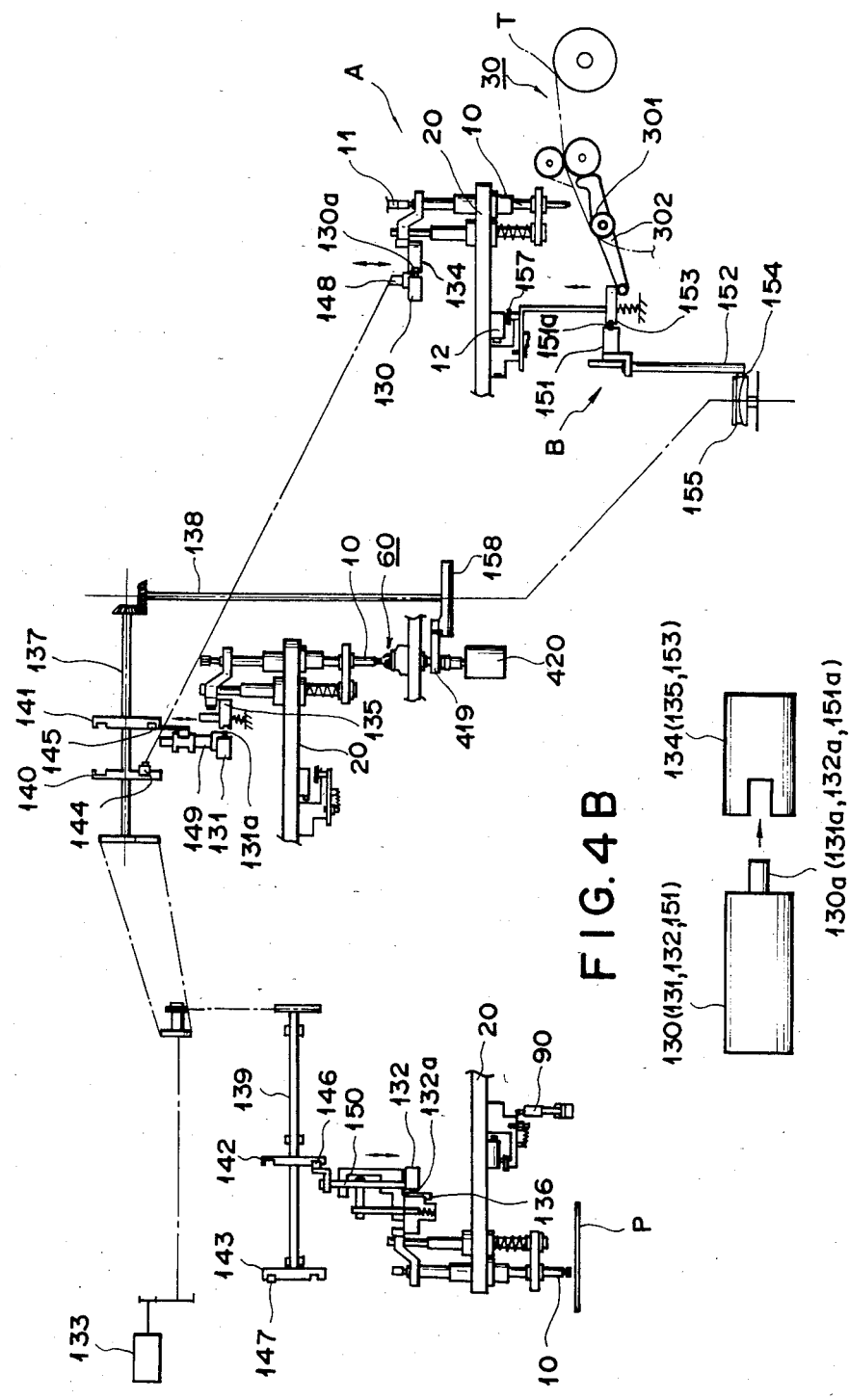

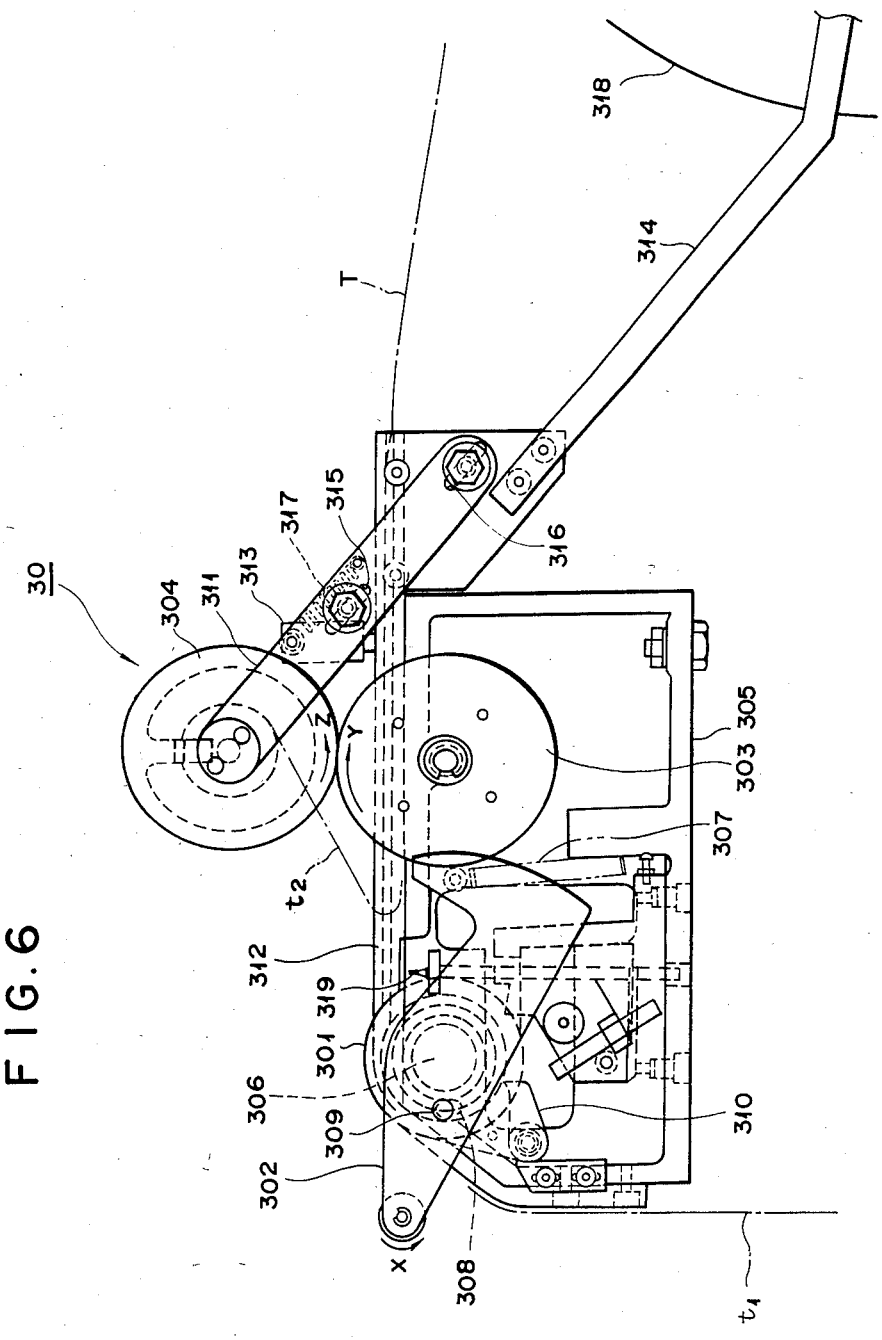

FIG. 21A
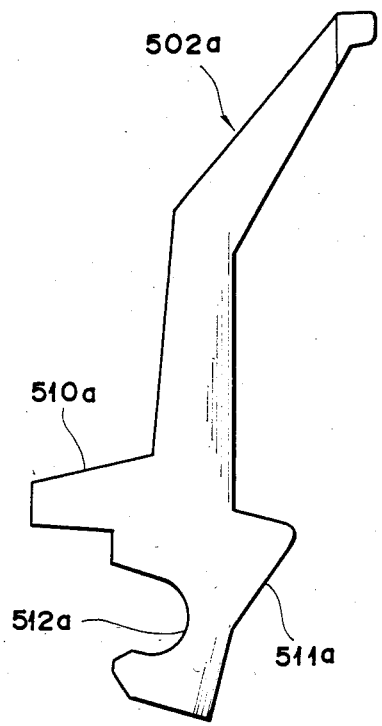
FIG. 21B
FIG. 21C
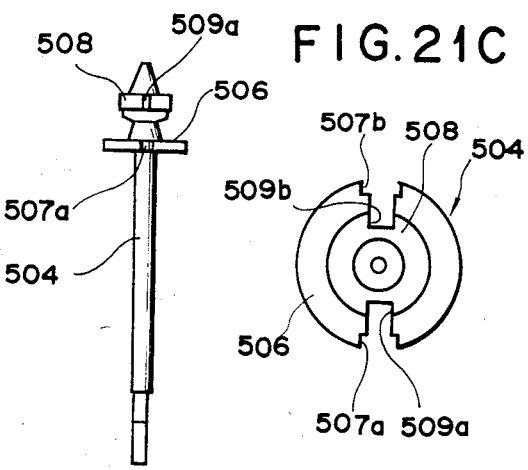
FIG. 21D
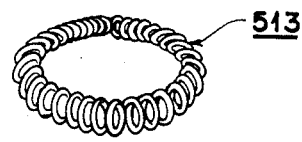

APPARATUS FOR AUTOMATICALLY MOUNTING CHIP-TYPE CIRCUIT ELEMENTS ON SUBSTRATE

BACKGROUND OF THE INVENTION

1. Field of the Invention

This invention relates to an apparatus for automatically mounting chip-type circuit elements on a substrate, and more particularly to an automatic mounting apparatus for automatically continuously mounting various kinds of chip-type circuit elements on a substrate for a printed circuit board.

2. Description of the Prior Art

Conventionally, various types of such an automatic mounting apparatus for chip-type circuit elements has been proposed and put in practice, which is generally constructed to continuously mount chip-type circuit elements on a single substrate while feeding several kinds of chip-type circuit elements in succession. However, in the conventional automatic mounting apparatus, when the failure in suction of a circuit element (hereinafter referred to as "suction failure") and/or the failure in suction of a circuit element in a correct position or posture (hereinafter referred to as "wrong posture") occur during the operation of sucking-up a circuit element by a mounting head, these defective circuit elements are not mounted on a substrate and only circuit elements being sucked up in correct positions or postures by the mounting heads are successively mounted on the substrate and the omitted circuit elements are properly mounted on the substrate after the mounting operations of various kinds of circuit elements are completed. This causes the mounting operation to be highly complicated and the operational efficiency to be substantially deteriorated.

In the automatic mounting apparatus of this kind, a plurality of mounting heads are required in order to successively mount various kinds of chip-type circuit elements on a substrate for a printed circuit board and that they are required to operate with satisfied reliability and at a high speed.

Also, in the automatic mounting apparatus of this kind, a tape having a plurality of chip-type circuit elements held thereon at equal intervals in a row (hereinafter referred to as "chip tape") is used so as to successively mount chip-type circuit elements on substrates. A plurality of the chip tapes having chip-type circuit elements different in kind from one another are respectively fed by a plurality of tape feeders incorporated in the automatic mounting apparatus. In the conventional automatic mounting apparatus, a plurality of the tape feeders are used each of which is generally constructed so as to intermittently rotate a tape feed drum one pitch a time with the forward movement of a base of the tape feeder horizontally slidably arranged, and peel a cover tape from the chip tape and wind up the peeled cover tape around a reel with the rearward movement of the base. Further, the mounting of circuit elements on a substrate is typically carried out in a manner such that the mounting heads moved according to a predetermined program successively take out or remove circuit elements from the chip tapes fed by the tape feeders arranged in a predetermined manner and mount the circuit elements on a substrate for a printed circuit board in order. The tape feeders which are adapted to carry out such operation are arranged along the moving passages of the respective mounting heads in a manner to be independent from one another every kind of circuit element. However, such construction of the tape feeder causes not only the maintenance and inspection of the tape feeder to require much time and labor but the replacement of a chip tape in the tape feeder to be highly troublesome due to the complication.

Still further, the conventional automatic mounting apparatus has a clamping mechanism incorporated therein which is used for carrying out the centering and turning of a circuit element. The clamping mechanism includes clamping claws pivotally supported at the intermediate portions thereof on a base of a circuit element turning device and arranged at positional intervals of 90°. The claws each are provided at the one end thereof with a gear to engage the opposite gears with each other, so that the claws may be synchronously operated with the vertical movement of the circuit element turning device. However, the clamping mechanism is substantially hard to actuate one pair of the claws in synchronism with the other pair of the claws.

SUMMARY OF THE INVENTION

The present invention has been made in view of the foregoing.

Generally speaking, in accordance with the present invention, an apparatus for automatically mounting chip-type circuit elements on a substrate for a printed circuit board which comprises a rotating disk; a plurality of mounting heads arranged on the surface of the rotating disk at regular intervals to downward direct nozzle tips thereof; a plurality of tape feeders for feeding chip tapes having chip-type circuit elements held thereon, the tape feeders being radially arranged toward the axis of rotation of the rotating disk below the passage of movement of the mounting heads; an X-Y table for carrying substrates on which the circuit elements are to be mounted, the X-Y table being arranged opposite to the tape feeders; the mounting heads successively sucking up the circuit elements from the chip tapes and mount the circuit elements on the substrate with the rotation of the rotating disk; and detecting means for detecting a defect of the circuit element such as a failure in suction of the circuit element by the mounting head, the wrong posture of the circuit element sucked up on the mounting head or the like; the rotating disk being controllably actuated to allow the mounting head other than the mounting head relating to the defect to suck up a circuit element of the same kind from the tape feeder and mount it on the substrate after the detecting means detect the defect.

In a preferred embodiment of the present invention, the automatic mounting apparatus further comprises a driving force transmission mechanism which includes hammer solenoid means having a solenoid pin projected when the hammer solenoid means is actuated, the hammer solenoid means being arranged between a drifting source and a driven mechanism of the automatic mounting apparatus to transmit power generated from the driving source through the solenoid pin of the solenoid hammer means to the driven mechanism.

In a preferred embodiment of the present invention, the tape feeders each comprise a chip tape feed drum; a cam lever for intermittently rotating the chip tape feed drum; a follower roll arranged to be abutted at the peripheral surface thereof against the cam edge of the cam lever; and a reel for winding up a cover tape of the chip tape which is arranged to be contacted with the follower roll; the cam lever being pivotally moved to intermittently rotate the chip tape feed drum to feed the chip tape one pitch at a time and rotate the follower roll by a predetermined angle to peel the cover tape from the chip tape by the reel rotated while being contacted with the follower roll.

In a preferred embodiment of the present invention, the tape feeders are arranged on a movable carriage which is detachably connected to a body of the automatic mounting apparatus.

In a preferred embodiment of the present invention, the automatic mounting apparatus further comprises a circuit element clamping mechanism comprising a socket formed into a concave shape; a plurality of clamping claws supported in the socket; the clamping claws each having an outer projection engaged with the upper edge of the socket and an inner projection pivotally engaged with an operating rod vertically movably inserted through the central portion of the socket; the clamping claws being arranged about the operating rod in the socket and projecting at the tip ends thereof from the socket; and a coiled spring of an annular shape disposed to elastically surround the portions of the clamping claws received in the socket to securely hold the claws with respect to the operating rod; the clamping claws being openably operated at the tip ends thereof about the inner projection pivotally engaged with the operating rod due to the bias of the coiled spring with the vertical movement of the operating rod.

In a preferred embodiment of the present invention, the automatic mounting apparatus further comprises a circuit element turning device for correcting the wrong posture of a circuit element held on the nozzle tip of the mounting head by suction; the mounting heads each being provided with a pair of clamping claws for clamping a circuit element held on the nozzle tip of the mounting head by suction; the circuit element turning device being provided with a pair of clamping claws for clamping the circuit element from all quarters in cooperation with the clamping claws of the mounting head.

Accordingly, it is an object of the present invention to provide an apparatus for automatically mounting chip-type circuit elements on a substrate which is capable of effectively overcoming the suction failure and wrong posture to smoothly and efficiently carry out the mounting of circuit elements on a substrate.

It is another object of the present invention to provide an apparatus for automatically mounting chip-type circuit elements on a substrate which is capable of actuating mounting heads with satisfied reliability and at a high speed.

It is a further object of the present invention to provide an apparatus for automatically mounting chip-type circuit elements on a substrate which is capable of readily carrying out the replacement of chip tapes and the maintenance and inspection of tape feeders.

It is still a further object of the present invention to provide an apparatus for automatically mounting chip-type circuit elements on a substrate which is capable of facilitating the centering and turning operation of a circuit element held on a mounting head.

Still other objects of the invention will in part be obvious and will in part be apparent from the specification.

The invention accordingly comprises the features of construction, combination of elements, and arrangements of parts which will be exemplified in the construction thereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 4A is a schematic view showing a driving force transmission mechanism employed in the automatic mounting apparatus shown in FIG. 1;

FIG. 4B is a front elevation view showing a hammer solenoid and an engagement piece member engaged with the hammer solenoid used in the driving force transmission mechanism shown in FIG. 4A;

FIG. 6 is a side elevation view showing one of tape feeders used in the automatic mounting apparatus shown in FIG. 1;

FIG. 15 is a schematic view showing components of the clamping mechanism of FIG. 13, wherein

FIG. 21 is a schematic view showing components of the clamping mechanism of FIG. 20, wherein FIG. 21A is a side elevation view of a clamping claw, FIG. 21B is a front elevation view showing an operating rod, FIG. 21C is a plan view of the operating rod, and FIG. 21D is a perspective view showing a coiled spring;

DETAILED DESCRIPTION OF THE PREFERRED EMBODIMENTS

Now, an apparatus for automatically mounting chip-type circuit elements on a substrate for a printed circuit board according to the present invention will be described hereinafter with reference to the accompanying drawings.

Figure 1:
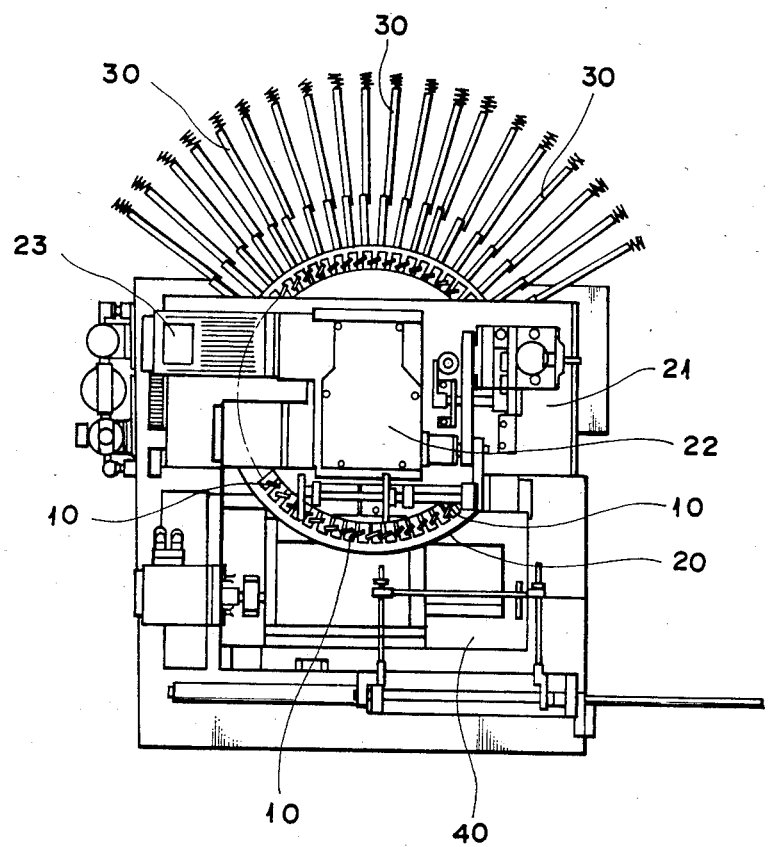
FIG. 1 is a plan view illustrating an embodiment of an apparatus for automatically mounting chip-type circuit elements on a substrate for a printed circuit board according to the present invention.
Figure 2:
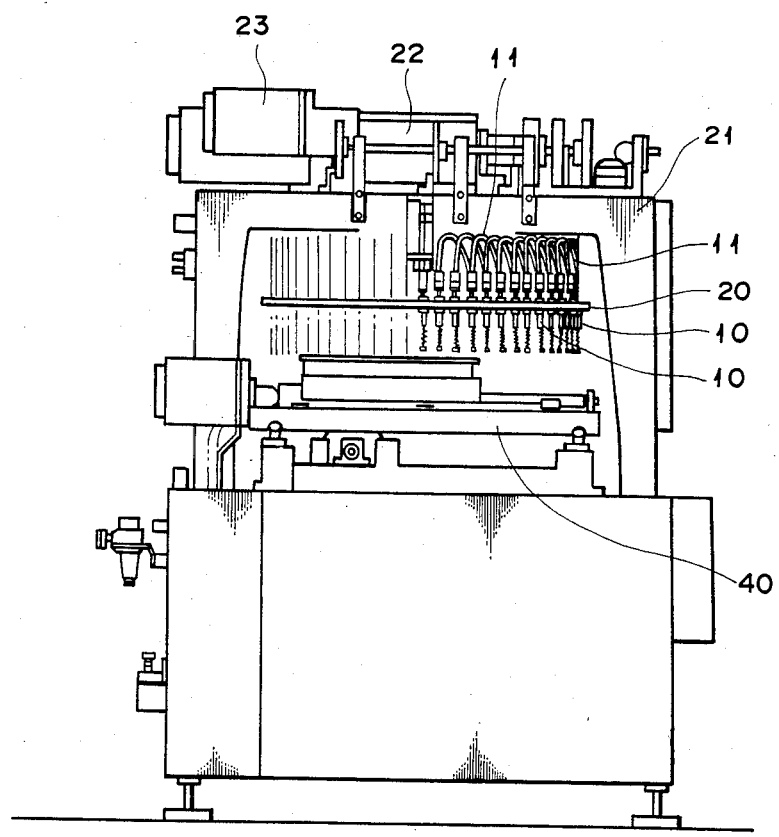
FIG. 2 is a front elevation view of the automatic mounting apparatus shown in FIG. 1.

FIGS. 1 and 2 generally illustrate an embodiment of an apparatus for automatically mounting chip-type circuit elements on a substrate according to the present invention. An automatic mounting apparatus of the illustrated embodiment generally comprises a plurality of mounting heads 10, a rotating disk 20 on which the mounting heads 10 are arranged, a plurality of tape feeders 30 arranged at a predetermined region along the periphery of the rotating disk 20, and an X-Y table 40 adapted to carry thereon substrates having adhesive applied on the portions thereof on which chip-type circuit elements are to be mounted. In the illustrated embodiment, sixty mounting heads 10 are arranged on the rotating disk 20 and twenty tape feeders 30 are arranged along a part of the periphery of the rotating disk 20 so as to feed twenty different kinds of chip-type circuit elements to the mounting heads 10. The mounting heads 10 each are mounted on the rim of the rotating disk 20 at predetermined intervals in a manner such that the distal end of a nozzle of the head 10 downward faces, as shown in FIG. 2. The mounting heads 10 each have a vacuum tube 11 connected to the upper end thereof which is adapted to apply vacuum pressure to the interior of the mounting head, so that the actuation of a vacuum valve 12 shown in FIG. 4A may allow the distal end or tip of the nozzle to suck up a chip-type circuit element through the vacuum tube 11. The rotating disk 20 is attached to an upper frame 21 of a substantially inverted U-shape and has a revolving shaft connected through a gear received in a gear box 22 to a drive motor 23 which is adapted to gradually carry out the speed changing as desired. In the illustrated embodiment, the drive motor 23 is disposed on the upper frame 21. The tape feeders 30 are adapted to feed chip-type circuit elements of the standard-type and those of the special-type different in kind from one another which are held on tapes or chip tapes and radially arranged so as to align the direction of transferring the chip tapes with the center of rotation of the rotating disk 20. Also, the tape feeders 30 each are provided to align the axis of movement of the mounting head 10 with the position at which a chip-type circuit element is removed from the chip tape (hereinafter referred to as "chip-type circuit element removing position") and position the circuit element removing position below the mounting head 10. The X-Y table 40 is disposed in a manner to be substantially opposite to the region at which the tape feeders 30 are arranged and is adapted to carry thereon substrates on which chip-type circuit elements are to be mounted by the mounting heads 10.

Figure 3A:
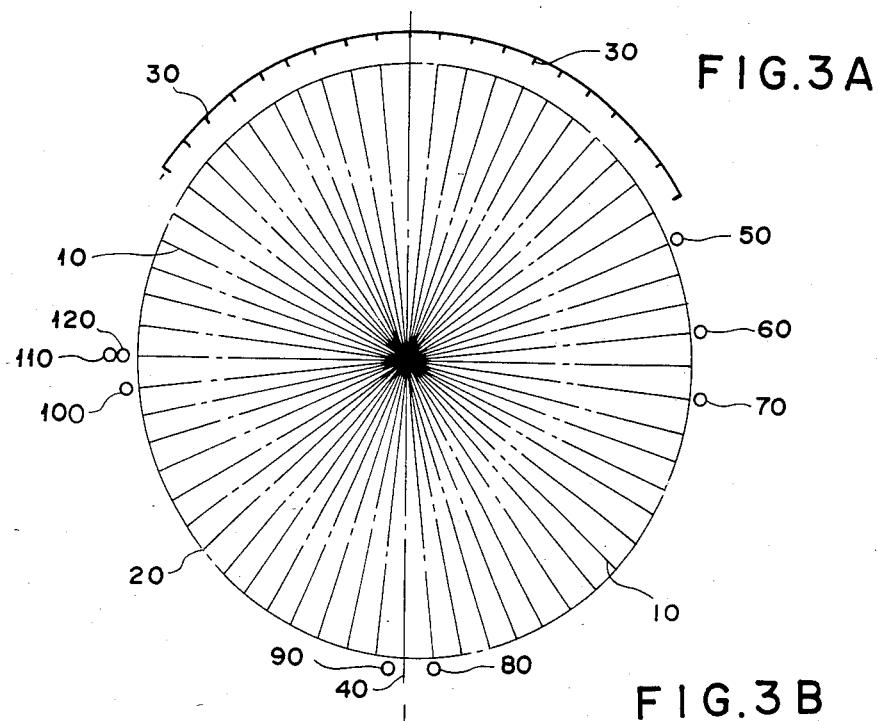
FIG. 3A is a schematic plan view schematically showing the layout of the automatic mounting apparatus of FIG. 1.

The automatic mounting apparatus of the illustrated embodiment, as shown in FIG. 3A, also includes a suction and direction confirming device 50 for confirming the suction of a chip-type circuit element by the mounting head 10 and the proper position or posture of the circuit element sucked up by the mounting head 10, a standard-type circuit element turning device 60 for changing the direction of a chip-type circuit element of the standard-type when it is wrong, a special-type circuit element turning device 70 for changing the direction of a chip-type circuit element of the special-type when it is wrong, and a circuit element reconfirming device 80 for reconfirming the suction of a chip-type circuit element which are arranged in turn at the front of arrangement of the tape feeders 30 and at the rear of the circuit element mounting centerline of the X-Y table 40. The suction and posture confirming device 50 serves to confirm the suction of a chip-type circuit element by the mounting head 10 and the posture of the circuit element sucked up by the mounting head 10 such as the vertical direction of an electrode of the circuit element sucked up by the mounting head. The suction and posture confirming device 50 may comprise a photocell or the like. The circuit element turning devices 60 and 70 serve to correct the direction of mounting of circuit elements of the standard-type and special-type depending upon the type of a circuit element, respectively, and are adapted to vary the position of a chip-type circuit element sucked by the tip of the nozzle when it is wrong. The circuit element reconfirming device 80 acts to detect the falling of a circuit element from the mounting head 10 during the passage through the circuit element turning devices 60 and 70. In the illustrated embodiment, the circuit element reconfirming device 80 is constructed in substantially same manner as the suction and direction confirming device 50. Further, the automatic mounting apparatus includes a suction release pin device 90 for removing a circuit element from the mounting head 10 when the mounting head 10 mounts a circuit element on a substrate, a direction returning device 100 for returning a circuit element of the special-type facing the wrong direction in the proper direction and a discharge device 110 for discharging the circuit element, which are arranged in turn at the rear of the circuit element mounting centerline of X-Y table 40. These devices 50–110 are arranged below the passage of movement of the mounting heads 10.

Figure 3B:
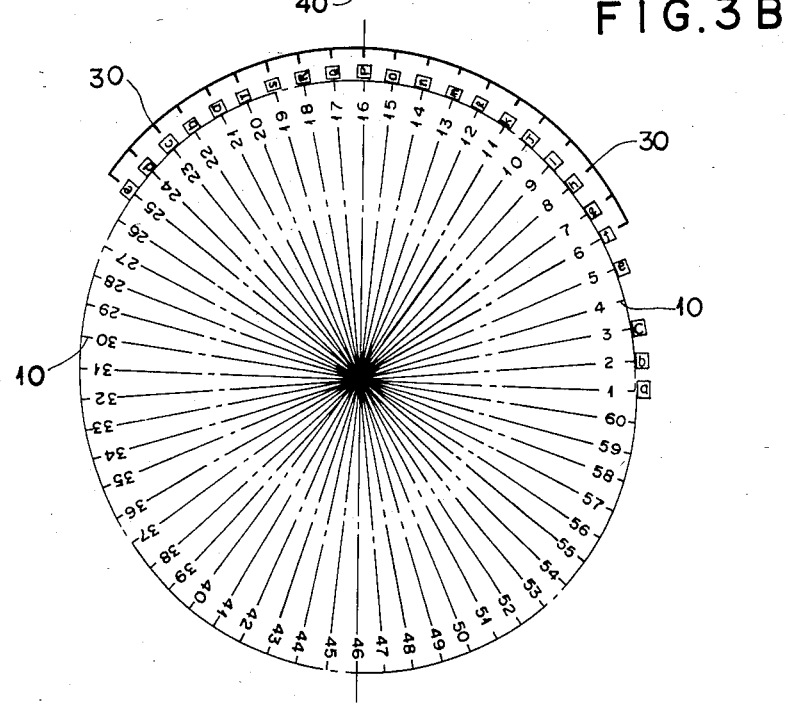
FIG. 3B is a schematic plan view showing the positional relationships between mounting heads and tape feeders in the automatic mounting apparatus of FIG. 1.

The automatic mounting apparatus of the illustrated embodiment constructed as described above is operated in a manner such that the mounting heads 10 subsequently suck up chip-type circuit elements from a plurality of the tape feeders 30, transfer the sucked circuit elements to the devices 50, 60, 70 and 80 with the rotation of the rotating disk 20 to subject the circuit elements to various inspections, and then are downward moved to begin the mounting of circuit elements passing the inspections on a substrate for a printed circuit board with a circuit element of a in parts number according to a sequence access system. On the contrary, when the failure in sucking up a circuit element or the suction of a circuit element in the improper direction or posture is detected by the device 50; the mounting head which failed to suck up a circuit element does not carry out the mounting motion, and the mounting head which sucked up a circuit element in the improper direction is not allowed to lower to the circuit element mounting position of the substrate arranged on the X-Y table 40 so that the circuit element may not be mounted on the substrate. Substitutedly, the rotating disk 20 is controlled to cause another mounting head arranged at the rear of the mounting head to carry out the suction and mounting of a circuit element of the same kind on the substrate. For example, when the suction failure or wrong posture is detected with respect to a mounting head of 4 in index number on which a chip-type circuit element of d in parts number is sucked up, a mounting head having an index number of 24 is adapted to suck up a circuit element of d in parts number from the tape feeder 30 and the rotating disk 20 is quickly rotated to allow the mounting head having the index number of 24 to carry out the operation of mounting the circuit element of d in parts number on the substrate, as shown in FIG. 3B. Also, supposing that the suction failure or wrong posture is detected in connection with a mounting head of 58 in index number of the sixty mounting heads; this is just before one cycle rotation of the rotating disk 20 is completed, accordingly, a mounting head having an index number indexed on the basis of the relationships between the kind of a circuit element to be mounted and the mounting heads which have already completed the mounting operation is selected to carry out the operation of sucking up the circuit element and the rotating disk 20 is quickly rotated to allow the mounting head to carry out the operation of mounting the circuit element on the substrate. In the illustrated embodiment, the control of such operation is accomplished by controlling the drive motor 23 of the rotating disk 20 by means of a rotary encoder and the mounting head 10 is adapted to carry out the circuit element mounting operation according to a random access system in addition to a sequence access system. Also, in the embodiment, the drive motor 23 is adapted to be slowly varied in rotational speed so that inertia due to the speed variation of the rotating disk 20 does not affect the circuit element mounting operation by the mounting heads. When the mounting head which sucked up a circuit element of wrong posture is moved in the rotational direction of the rotating disk 20 by the rotating disk 20, the direction return device 100 returns the circuit element held on the tip of the mounting head 10 to the direction in which the mounting head has sucked up the circuit element from the feeder 30 in a manner as described hereinafter in the case that the circuit element is of the special-type and then the discharge device 110 removes and discharges the circuit element of wrong posture from the nozzle tip of the mounting head 10 irrespective of being the standard-type or the special-type. The removal of the circuit element of wrong posture from the mounting head 10 in the discharge device 110 is carried out by the actuation of the suction release pin device 120.

The mounting heads 10 each are adapted to move downward to remove a chip-type circuit element by suction from a chip tape fed by the tape feeder 30 and mount the circuit element on the substrate with subjecting it to suction release operation of the device 90. Also, the mounting heads 10 each are adapted to move downward with respect to the devices 50, 60, 70, 80, 100 and 110 to subject the sucked circuit element to various inspections, directional correction, and so on. Such downward movement of the mounting heads 10 are carried out by means of a driving force transmission mechanism.

A drive mechanism for the mounting heads may comprise, for example, air cylinders fitted on the respective mounting heads and electromagnetic valves for carrying out the actuation and control of the air cylinders. However, the drive mechanism utilizing such a combination of the air cylinders and electromagnetic valves requires a large number of parts to cause an increase in manufacturing cost. Also, the drive mechanism has another defect of failing to carry out the desired operation precisely because the air cylinders often cause leakage of air and render the driving speed of the mechanism disadvantageously slow.

In view of the foregoing, in the illustrated embodiment, a driving force transmission mechanism is incorporated which is constructed in a manner such that hammer solenoid means adapted to actuate in response to an electrical command is interposedly arranged between a driving source and a driven mechanism of the apparatus so that power generated from the driving source may be transmitted through a pin projected due to the actuation of the hammer solenoid means to the driven mechanism.

The driving force transmission mechanism of such construction in the illustrated embodiment is readily manufactured at a low cost because of substantially requiring only the arrangement of the hammer solenoid means. The driving force transmission mechanism also has another advantage capable of precisely and positively actuating the driven mechanism because the hammer solenoid means never causes the leakage of air and the like and rapidly carries out the response.

The driving force transmission mechanism will be described in detail with reference to FIGS. 4A and 4B.

FIG. 4A mainly shows a driving force transmission mechanism being in cases where causes the mounting heads 10 to move downward so as to remove a chip-type circuit element by suction from a chip tape T fed by the tape feeder 30, causes the mounting heads 10 to move downward with respect to the circuit element turning device 60 to cause the circuit element to face the proper direction, and causes the mounting heads 10 to move downward so as to mount the circuit element on a substrate P for a printed circuit board. The driving force transmission mechanism includes hammer solenoids 130, 131 and 132 and is incorporated in the automatic mounting apparatus so that it causes the mounting heads 10 to carry out the desired movement through a drive motor 133 acting as the driving source to accomplish the mounting of circuit elements on the substrate P for a printed circuit board. Such downward movements of the mounting heads 10 are carried out by means of the hammer solenoids 130, 131 and 132 which serve to transmit power of the drive motor 133 therethrough to the respective driven mechanisms. The driven mechanisms include engagement piece members 134 and 135 which respectively engage with solenoid pins 130a and 131a operated in a manner to project from the hammer solenoids 130 and 131, and are adapted to downward move the mounting heads 10 only when these engage each other. To the driven mechanisms is transmitted driving force generated from the drive motor 133 acting as a common driving source through rotating shafts 137, 138 and 139 connected to the drive motor 133. The connection between the drive motor and the driven mechanisms of the apparatus is indicated by dashed lines in FIG. 4A. The rotating shafts 137 and 139 have cam discs 140 and 141, and 142 and 143 fitted thereon, respectively. The cam discs 140 to 142 are connected through cam followers 144, 145 and 146 to actuating rods 148, 149 and 150, respectively, and the actuating rods 148, 149 and 150 are mounted at the lower ends thereof to the hammer solenoids 130, 131 and 132, respectively.

In the driving force transmission mechanism constructed as described above, the circuit element sucking operation of the mounting head 10 initiates when the hammer solenoid 130 receives an operation command. This engages the solenoid pin 130a with the engagement piece member 134 to downward move the hammer solenoid 130 along a cam groove of the cam disc 140 to lower the mounting head 10. Then, the mounting head 10 holds a chip-type circuit element at the nozzle tip thereof from the tape feeder 30 by suction and then is upward moved along the cam groove of the cam disc 140 to the original position. Concurrently, the pin 130a of the hammer solenoid 130 is retreated to stop the mounting head at a predetermined position. In the circuit element turning device 60, an operation command is supplied to the hammer solenoid 131. This causes the mounting head 10 sucking up the circuit element to be downward moved with respect to the circuit element turning device 60 through the cam disc 141 and cam follower 145. Also, the mounting head 10 sucking up the circuit element in an improper posture is downward moved with respect to the discharge device 110 through the cam disc 143 and a cam follower 147 so as to discharge the defective circuit element by the discharge device 110. The downward movement of the mounting head 10 with respect to the circuit element turning device 70 will be described hereinafter. The mounting of the circuit element is carried out by releasing a holding lever 136 by a pin 132a of the hammer solenoid 132 to downward move the mounting head 10. Also, as described hereinafter, the illustrated embodiment may be constructed to allow the tape feeder 30 to carry out the operation of intermittently feeding a chip tape by means of a hammer solenoid 151.

As can be seen from the foregoing, the driving force transmission mechanism can be constructed in a simple manner and at a low cost because the driving force is transmitted to the driven mechanisms by means of the hammer solenoids. Also, the hammer solenoids quickly respond to the command, resulting in the driven mechanisms being precisely actuated according to predetermined timing.

Figure 5:
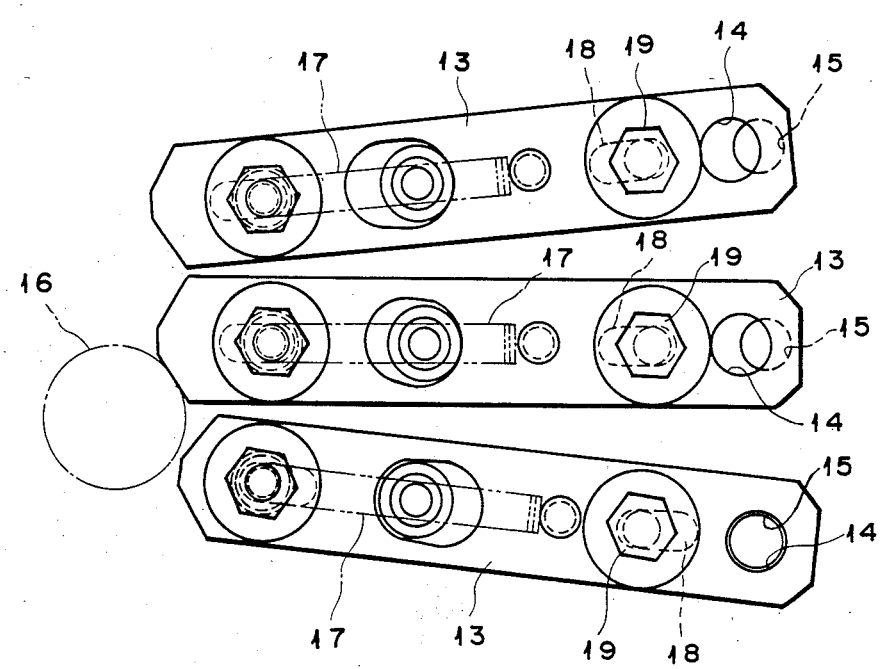
FIG. 5 is a plan view showing a mechanism for applying vacuum pressure to mounting heads.

In the automatic mounting apparatus of the illustrated embodiment, the application of vacuum pressure to the mounting heads 10, as shown in FIG. 5, is carried out by slidingly moving sliding plates 13 in the vicinity of the rotating disk 20 to align air passages 14 provided at the sliding plates 13 with holes 15 communicated with a vacuum valve 12. The sliding plates 13 are supported by bolts 19 inserted through elliptic holes 18 so that they may be forcedly slidably pushed by a ball 16 provided on the body of the mounting apparatus and when the force is released, they may be returned to the original position by means of tension springs 17.

In the illustrated embodiment, the tape feeder 30 is constructed in a manner as shown in FIG. 6. More particularly, the tape feeder 30 comprises a cam lever 302 for intermittently rotating a drum 301 for feeding a chip tape T, a follower roll 303 arranged to about the peripheral surface thereof against the cam edge of the lever 302, and a reel 304 for winding up a cover tape $t_2$ of the chip tape which is arranged so as to slidingly contact with the follower roll 303. In the tape feeder 30 of such construction, the tape feed drum 301 is intermittently rotated due to the pivotal movement of the cam lever 302 to feed the chip tape T one pitch a time and rotate the follower roll 303 by a predetermined angle, so that the reel 304 rotated in contact with the follower roll 303 may peel and wind up the cover tape $t_2$ from the chip tape T.

Thus, it will be noted that the tape feeder 30 is simple in structure and readily accomplishes replacement of the chip tape, because the cam lever 302 is pivotally moved to intermittently rotate the tape feed drum 301 and concurrently rotate the reel 304 through the follower roll 303 by a predetermined angle.

The tape feeder 30 is adapted to forward feed chip-type circuit elements arranged in a row on the chip tape T one by one every pitch feed. The chip tape T comprises a base tape $t_1$ formed on the surface thereof with a plurality of recesses at predetermined intervals for receiving circuit elements therein and a cover tape $t_2$ for covering the surface of the base tape $t_1$. The cover tape $t_2$ is adapted to be peeled from the base tape $t_1$ to expose circuit elements on the way of forward feeding the tape T. At the front based on the direction of feeding the tape T, the mounting heads 10 are arranged so as to be vertically movable which serve to mount circuit elements on a substrate for a printed circuit board. The mounting heads each are adapted to take out a circuit element from the base tape $t_1$ by suction.

In the tape feeder 30, the tape feed drum 301 is mounted on a base 305 to intermittently feed the base tape $t_1$ one pitch at a time which corresponds to the interval between the adjacent circuit elements arranged on the base tape $t_1$. The tape feed drum 301 is provided on the circumferential surface thereof with a plurality of projecting teeth (not shown), which are fittedly engaged with holes (not shown) formed at the edge of the base tape $t_1$ in the longitudinal direction thereof to feed the tape T while holding the base tape $t_1$. The drum 301 has a supporting shaft 306 on which the cam lever 302 is fitted through clutch means for applying rotating force to the shaft 306 only in a predetermined direction. The cam lever 302 is adapted to be pivotally moved about one end thereof in the direction indicated by an arrow X by means of a suitable drive device, and the tape feed drum 301 is rotated by an angle corresponding to one pitch feed of the tape with the pivotal movement of the cam lever 302. Also, the cam lever 302 is pulled at the other end thereof by a tension spring 307 stretchedly provided between the cam lever 302 and the base 305, so that it may be rotatedly returned to the original position when it is pivotally moved against the tension spring 307. The pivotal movement of the cam lever 302 is guided by the engagement between an elliptic hole 308 provided on the side surface of the base 305 and a pin 309 of the cam lever 302. The reverse rotation of the tape feed drum 301 at the time of returning the cam lever 302 is effectively prevented by the engagement between the drum 301 and a ratchet 310 provided at the base 305. The end of the cam lever 302 pulled by the tension spring 307 is formed with a cam edge of arcuate contour, which is adapted to abut against the circumferential surface of the follower roll 303. The follower roll 303 comprises a slip roll having a circumferential surface formed of a material of large frictional resistance such as rubber or the like. The reel 304 for winding up the cover tape $t_2$ is arranged so as to be contracted at the periphery thereof with the peripheral edge of the follower roll 303. The reel 304 is adapted to be rotated by the pivotal movement of the cam lever 302 transmitted through the follower roll 303 thereto to carry out the peeling of the cover tape $t_2$ from the chip tape T and the winding-up of the cover tape $t_2$. Also, the reel 304 is attached through a supporting arm 311 to a guide frame 312 which forms a passage for feeding the tape T therethrough. The guide frame 312 is provided with a plate spring lever (not shown) at the portion thereof which forms the tape feeding passage which serves to press the base tape $t_1$ down to facilitate the peeling of the cover tape $t_2$ from the tape T. Furthermore, the guide frame 312 is arranged so as to be detachable from the base 305 by means of a knob 313 and provided at the rear end thereof with a reel arm 314 on which a support reel 318 for the tape T is mounted.

The tape feeder 30 constructed as described above is driven by the drive motor 133 described above the respect to the mounting head 10 with reference to FIG. 4A and is operated in a manner such that the hammer solenoids 130 and 151 (FIG. 4A) incorporated in driving mechanisms A and B set the operation and timing of the mounting head 10 to carry out the pivotal movement of the cam lever 302. The hammer solenoid 130, as described above, carries out the operation of projecting the solenoid pin 130a when an electric operation command is supplied thereto, and the hammer solenoid 151 likewise is actuated to project a solenoid pin 151a when an electric operation command is supplied thereto; so that driving force may be transmitted to the desired driven mechanisms when the pins 130a and 151a are operationally engaged with the operation sections of the driving mechanisms A and B. The driving mechanism B for the tape feeder 30 is constructed in a manner such that the hammer solenoid 151 is fitted on the upper portion of an actuating rod 152 to allow the solenoid pin 151a to be engageable with an engagement piece member 153 supported to be vertically variable in position and the actuating rod 152 is provided at the lower end thereof with a cam follower 154 which is adapted to be slided in a cam groove of a cam disc 155 mounted on the rotating shaft 138 connected to the drive motor 133 with the rotation of the cam disc 155 to vertically move the actuating rod 152. In the driving mechanism B constructed as described above, when the hammer solenoid 151 is actuated to cause the pin 151a to be engaged with the engagement piece member 153, the actuating rod 152 is lowered along the cam groove of the rotated cam disc 155. This causes the piece member 153 to be downward moved to pivotally move the cam lever 302 engaged with the piece member 153. Also, the hammer solenoid 151 may be constructed to carry out the operation of switching the vacuum valve 12 for supplying vacuum pressure to the mounting head 10 by means of an actuating plate 157.

When the cam lever 302 is pivotally moved in the direction indicated by the arrow X in FIG. 6, the tape feed drum 301 mounted on the supporting shaft 306 is rotated in the same direction by one pitch to transfer the base tape $t_1$ having circuit elements carried thereon. This causes a circuit element to be positioned right below the mounting head 10, which is downward moved in synchronism with such movement to suck up the circuit element at the nozzle tip thereof and then upward moved in order to carry out the following mounting operation.

With feeding of the chip tape T, the cam lever 302 which is contacted at the cam edge thereof with the follower roll 303 rotates the follower roll 303 in the direction indicated by an arrow Y in FIG. 6 to then rotate the reel 304 slidedly contacted with the follower roll 303 by a predetermined angle in the direction indicated by an arrow Z, to thereby carry out the peeling of the cover tape $t_2$ from the chip tape T under tension and the winding-up of the peeled cover tape. The winding-up of the cover tape $t_2$ by the reel 304 is highly facilitated because the base tape $t_1$, as described above, is held down on the frame 312 by the plate spring lever or the like. Also, when the above-described operation is completed, the hammer solenoid 151 is then disengaged from the engagement piece member 153 and the piece member 153 is then upward moved away from the cam lever 302; so that the cam lever 302 is pivotally moved under tension due to the tension spring 307 by means of the clutch mounted on the supporting shaft 306, to thereby to be returned to the original position separately from the feed drum 301.

In the illustrated embodiment, the tape feeder 30 is so constructed that the upper portion including the reel 304, the support reel 318 for the chip tape T and the guide frame 312 is detachably formed by means of the knob 313. Also, the tape feeder 30 may be constructed in a manner such that the support arm 311 for the cover tape reel 304 is vertically movably mounted on the guide frame 312 by means of bolts inserted through elliptic holes 315 and 316 and a tension spring 317 is stretched between the support arm 311 and the knob 313 to apply tension to the reel 304, so that the reel 304 may be movable in the vertical direction. Such construction allows the reel 304 to be gradually moved in the downward direction with the winding-up of the cover tape $t_2$ and upward moved when the cam lever 302 is returned to the original position, to thereby prevent the reaction due to the pivotal movement of the cam lever 302 at the time of the return from being applied to the cover tape $t_2$.

Figure 7A:
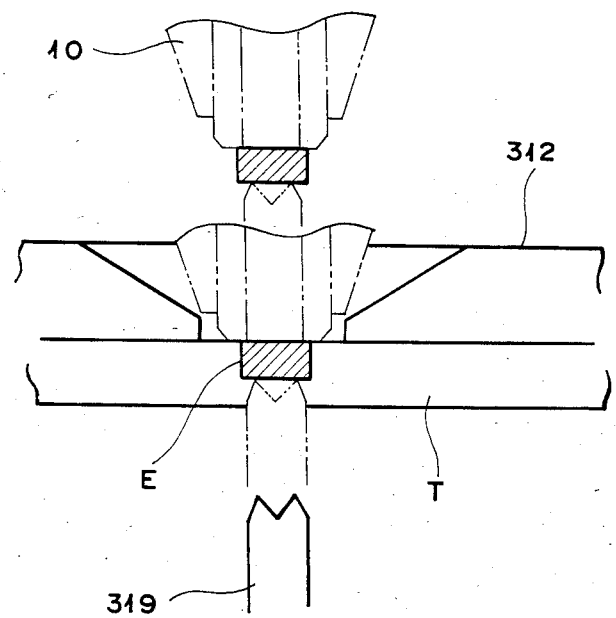
FIG. 7A is a schematic view showing a push pin incorporated in each tape feeder.
Figure 7B:
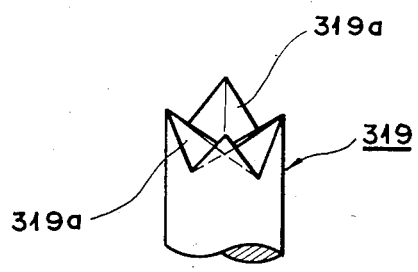
FIG. 7B is a perspective view showing the configuration of the tip end of the push pin shown in FIG. 7A.
Figure 8:
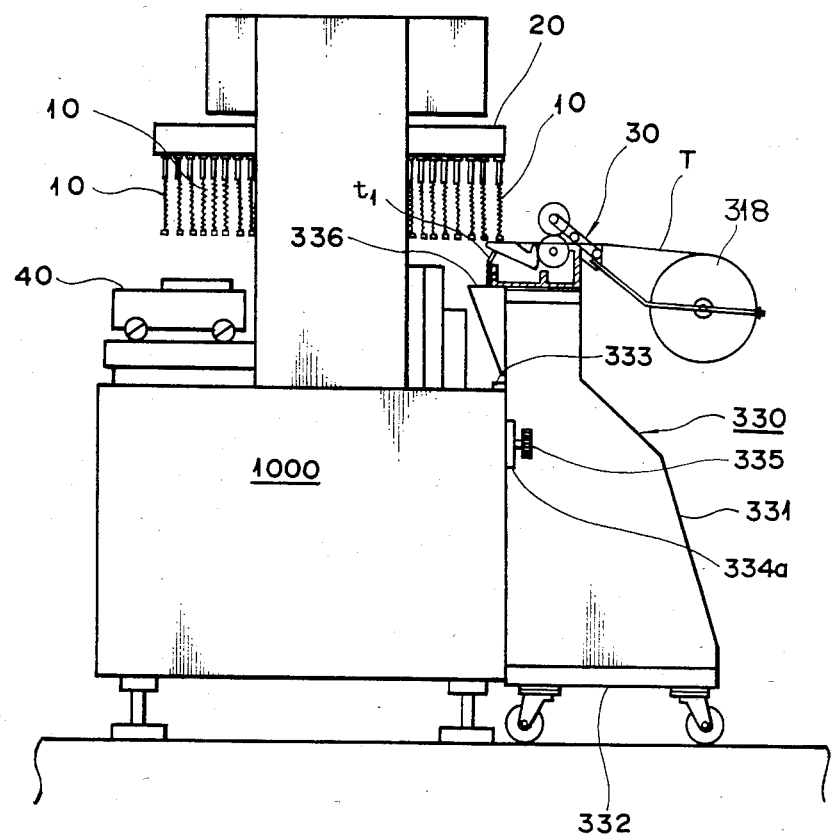
FIG. 8 is a schematic side elevation view of the automatic mounting apparatus shown in FIG. 1 in which a carriage on which tape feeders are arranged is incorporated.
Figure 9:
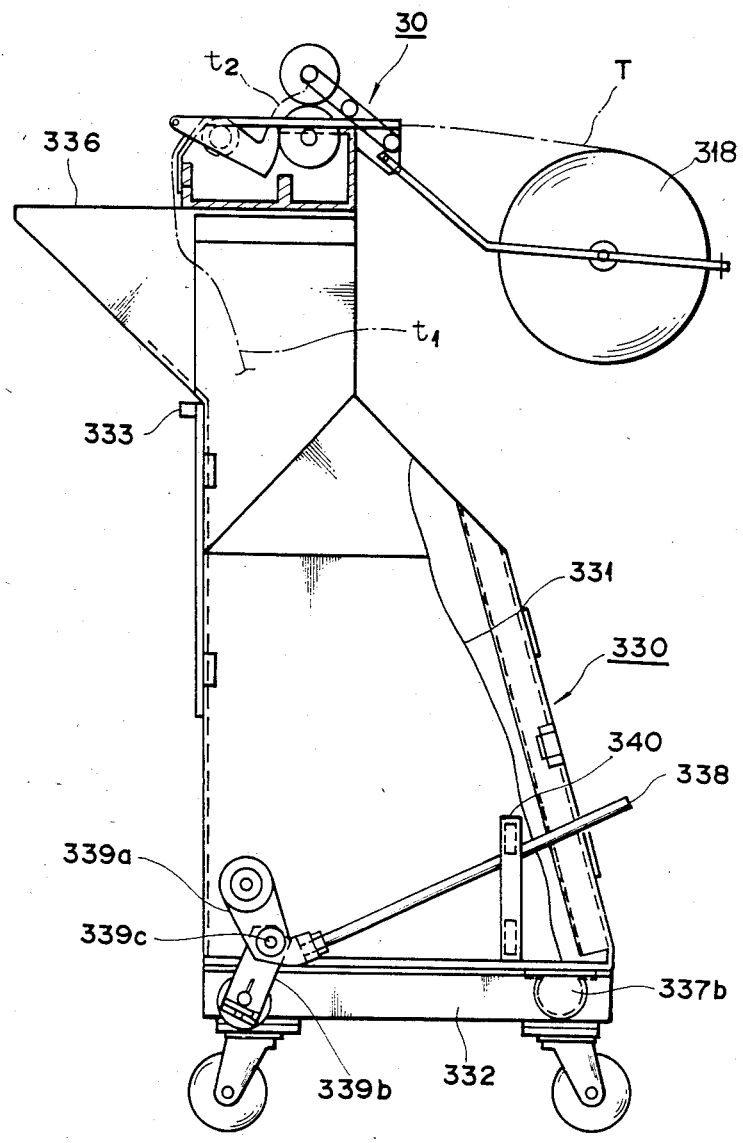
FIG. 9 is a side elevation view of the tape feeder mechanism shown in FIG. 8.

Further, in the illustrated embodiment, the tape feeder 30 is constructed in a manner such that in order to allow the mounting heads 10 to positively suck up chip-type circuit elements received in the recesses of the chip tape T, the tape feeder 30, as shown in FIGS. 6 and 7A, is provided with a push pin 319 which serves to push circuit elements E through the base tape or throughholes formed at the base tape. The push pin 319 may be formed to have a tip end of truncated pyramid shape. Alternatively, the push pin 319 may be provided at the tip end thereof with a few acute teeth 319a as shown in FIG. 7B. Such configuration of the push pin 319 allows the contact area between the tip end of the push pin and each of the circuit elements E to be significantly decreased and effectively carry out the pushing-up of the circuit elements. Furthermore, the upper portion of the tape feeder 30 is readily disconnected from the base 305 by removing the knob 313 from the base 305, resulting in the replacement of the chip tape T being significantly facilitated.

Thus, it will be noted that the tape feeder 30 used in the illustrated embodiment accomplishes the feeding of the chip tape and the winding-up of the cover tape in synchronism with each other with a simple structure, to thereby ensure the smooth feeding of circuit elements and the operation of mounting the elements with good efficiency.

Further, the automatic mounting apparatus of the illustrated embodiment, as shown in FIGS. 8 to 11, includes a carriage 330 on which all the tape feeders 30 are arranged in a predetermined manner and which is adapted to be detachably connected to a body 1000 of the automatic mounting apparatus. The carriage 330 of such construction allows the replacement of the chip tape T in the tape feeder 30 to be readily carried out by disconnecting the carriage 330 from the body 1000.

More particularly, the carriage 330 comprises a carriage body comprising a tape receiving box 331 for receiving the empty base tape $t_1$ discharged after the removal of circuit elements from the chip tape T and caster means 332 for supporting the tape receiving box 331 thereon. The carriage 330 is positioned with respect to the body 1000 of the automatic mounting apparatus by fitting an engagement piece member 333 provided to forward project from the tape receiving box 331 in a recess provided at the body 1000 of the automatic mounting apparatus and detachably connected to the body 1000 by detachably fixing connecting plates 334a and 334b provided on both sides of the box 331 on the body 1000 by means of screwable knobs 335. When the carriage 330 is connected to the body 1000, the tape feeders 30 are radially arranged on a supporting member of the carriage 330 to be directed to the axis of rotation of the rotating disk 20 to allow the mounting heads 10 to subsequently suck up circuit elements fed from the tape feeders 30 with the rotation of the rotating disk 20 carried out according to a predetermined program.

Figure 10:
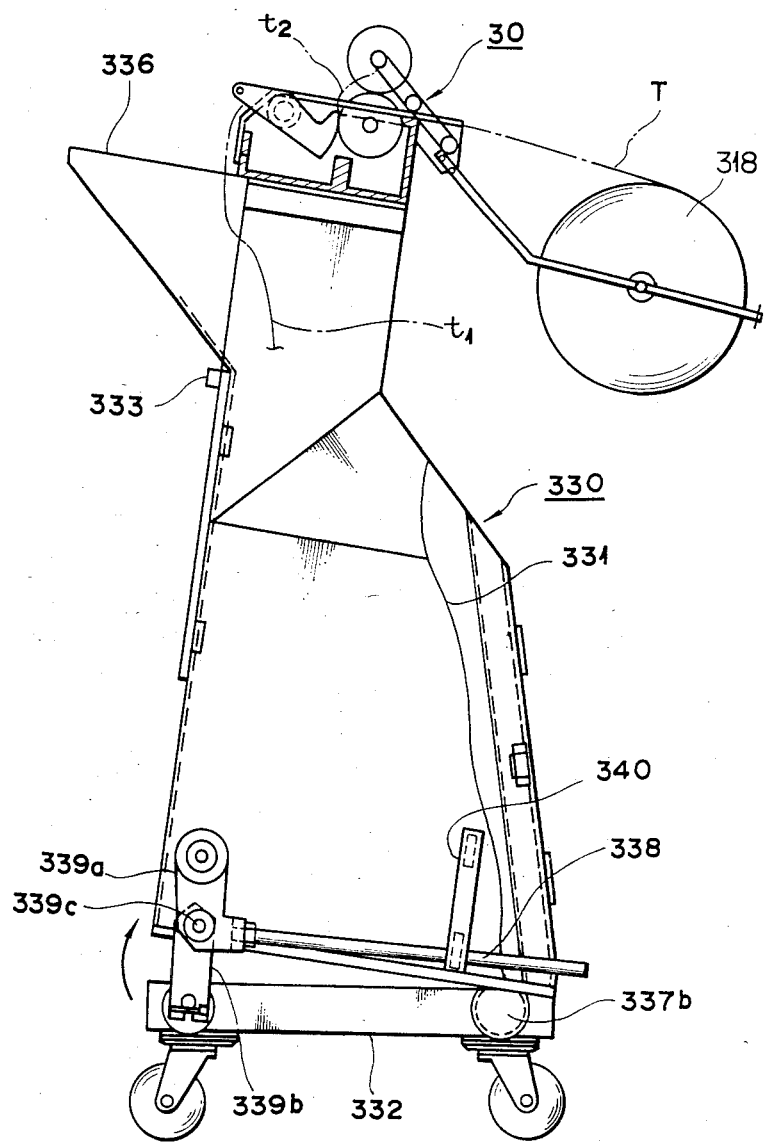
FIG. 10 is a side elevation view of the tape feeder mechanism of FIG. 8 in an inclined state.
Figure 11:
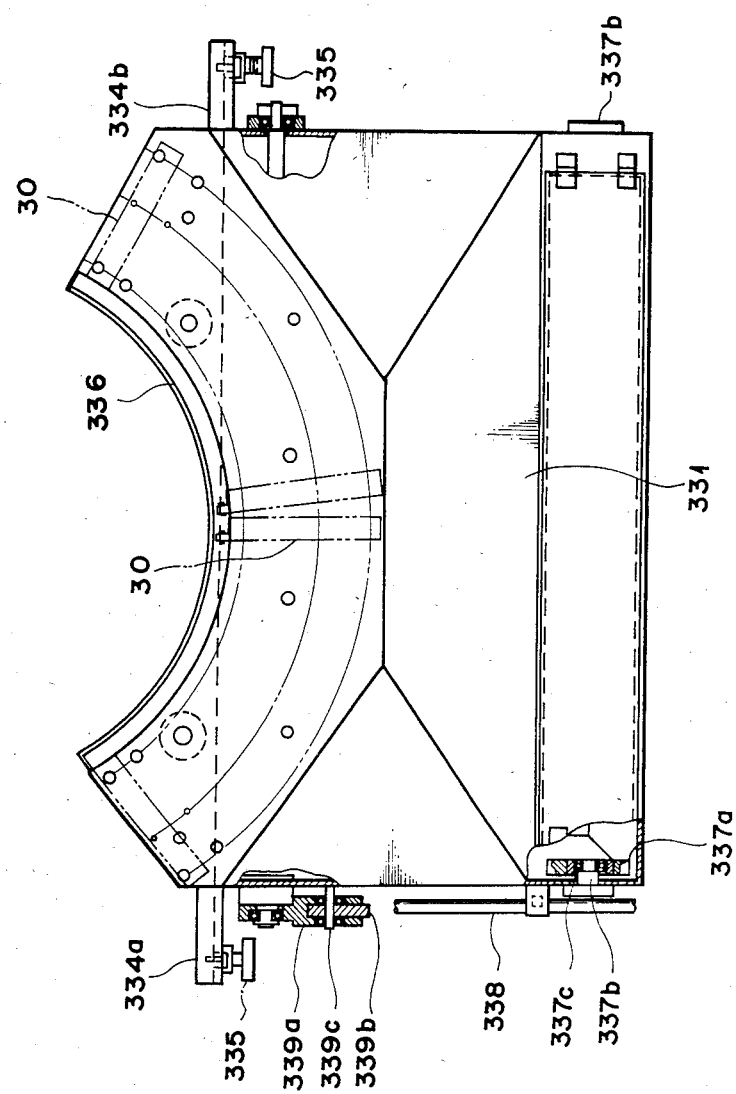
FIG. 11 is a plan view of the tape feeder mechanism shown in FIG. 8.

The empty base tape $t_1$ discharged from each of the tape feeders 30 after the removal of circuit elements from the chip tape T by the mounting heads 10 is received through a receiving port 336 provided at the receiving box 331 in the box 331. The port 336 is formed on the front side of the receiving box 331 to laterally extend so that all the empty base tapes $t_1$ discharged from the tape feeders 30 may be effectively fed therethrough to the tape receiving box 331. The carriage 330 has a horizontal shaft 337b inserted through the side of the tape receiving box 331 into the box 331 and rotatably mounted through bearings 337c on a pair of brackets 337a fixed on the caster means 332 to upward project therefrom, so that the receiving box 331 may be upward tiltably mounted on the caster means 332 about the shaft 337b to upward move the receiving port 336 due to the pivotal movement of the tape receiving box 331 about the lower portion of the front side of the receiving box 331. In the illustrated embodiment, the operation of tilting the receiving box 331 is carried out by means of an operating bar 338. The operating bar 338 is connected at one end thereof to a link plate 339a pivotally mounted on the receiving box 331, which is then connected through a supporting shaft 339c to a link plate 339b pivotally mounted on the caster means 332, so that the link plates 339a and 339b may be extendable therebetween. Also, the operating bar 338 is vertically movable at the other end thereof along a guide frame 340 vertically mounted on the side of the receiving box 331, so that the pushing-down of the operating bar 338 along the guide frame 340 may carry out the extension between the link plates 339a and 339b to tilt the receiving box 331 about the horizontal shaft 337b toward the front side as shown in FIG. 10.

On the carriage 330 constructed as described above are arranged a plurality of the tape feeders 30 in a predetermined manner. Thus, all the tape feeders 30 are disconnected together from the body 1000 of the automatic mounting apparatus at a time by disengaging the knobs 335 and disconnecting the engagement piece member 333 from the body 1000, so that a plurality of the chip tapes T may be substantially concurrently replaced. At that time, the pushing-down of the operating bar 338, as described above, causes the receiving box 331 to be tilted toward the front side thereof or an operator to facilitate the replacement of the tapes T. Further, all the empty base tapes $t_1$ discharged from the tape feeders 30 are received in the box 331 to keep the work place in proper arrangement and facilitate the disposal of the empty tapes $t_1$.

Thus, it will noted that the tape feeder assembly in the illustrated embodiment readily and rapidly carries out the replacement of the chip tapes and the like to significantly improve the operating efficiency.

Figure 12:
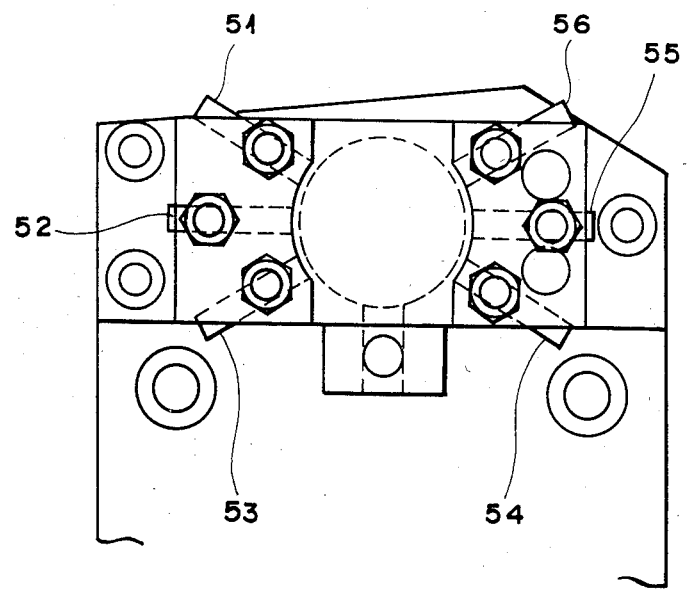
FIG. 12 is a plan view showing a device for detecting the suction failure and wrong posture of a circuit element.
Figure 13:
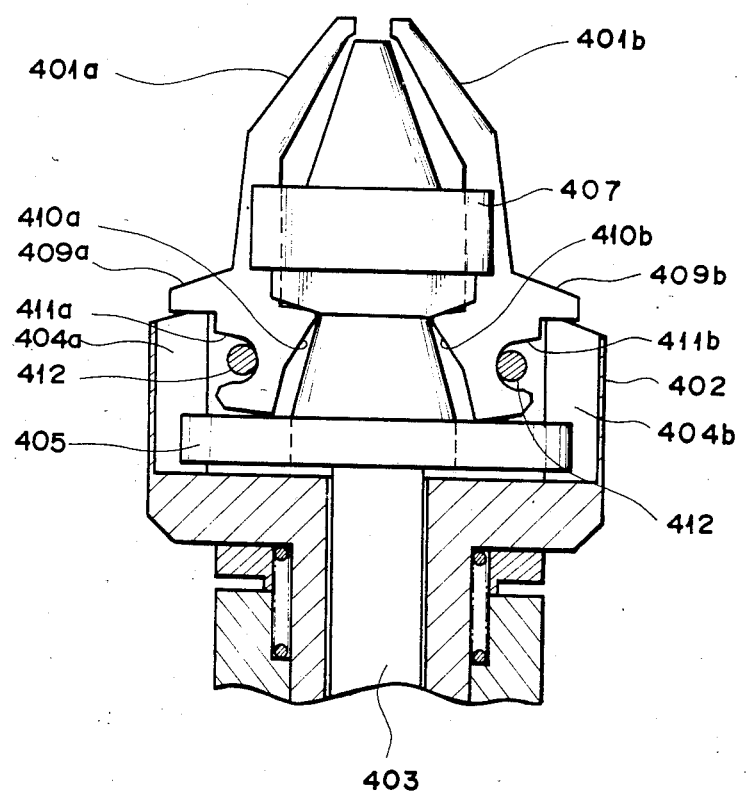
FIG. 13 is a vertical sectional view showing a circuit element clamping mechanism for a standard-type circuit element employed in the automatic mounting apparatus shown in FIG. 1.
Figure 14:
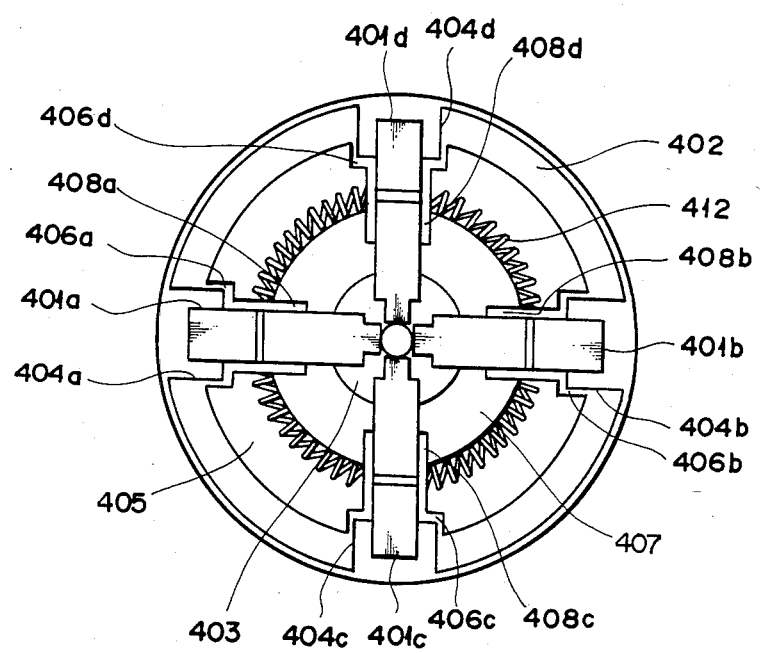
FIG. 14 is a plan view of the clamping mechanism shown in FIG. 13.
Figure 15A:
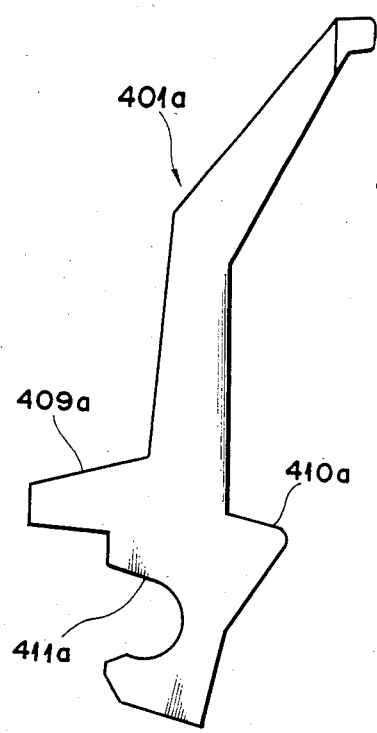
FIG. 15A is a side elevation view of a clamping claw.
Figure 15B:
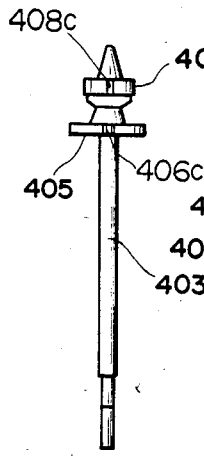
FIG. 15B is a front elevation view showing an operating rod.
Figure 15C:
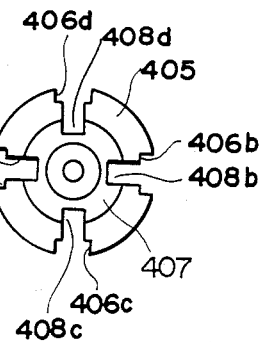
FIG. 15C is a plan view of the operating rod.
Figure 15D:
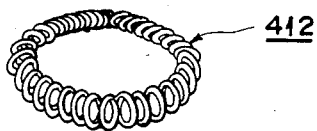
FIG. 15D is a perspective view showing a coiled spring.

In the illustrated embodiment, the suction failure and wrong posture detecting device 50, as described above, comprises photocell means. Preferably, the detecting device 50 comprises a photocell arranged to be aligned with the axis of the mounting head 10 below the mounting head in order to detect the suction failure and a plurality of photocells arranged in the direction perpendicular to the nozzle tip of the mounting head to detect the wrong posture. In the illustrated embodiment, as shown in FIG. 12, three photocells 51, 52 and 53 are arranged to detect the wrong posture and correspondingly three receptors 54, 55 and 56 are provided to be opposite to the photocells 51, 52 and 53, respectively. The photocells and receptors are arranged to provide difference in level therebetween, to thereby detect the suction of a circuit element in standing posture as well as the suction failure.

The circuit element turning devices 60 and 70 and the direction return device 100 each preferably include a clamping mechanism which comprises claws arranged in all directions to uniformly carry out the clamping of a circuit element from all guarters.

Now, such construction will be described taking the circuit element turning device 60 as an example with reference to FIGS. 13 to 18.

The clamping mechanism comprises a socket 402 provided with a recess, an operating rod 403 inserted through the socket 402 to be vertically movable and four claws 401a-401d arranged in the socket 402 at angular intervals of 90° so as to upward project therefrom. The socket 402 has a round plane configuration and is integrally formed at the inner periphery thereof with four rib-like guide members 404a-404d of a given width at regular intervals. The guide members 404a-404d serve to guide the vertical movement of the operating rod 403 and, for this purpose, the guide members are fitted in cutouts 406a-406d formed at a lower flange 405 of the operating rod 403. The operating rod 403 is also provided with an upper flange 407 of a smaller diameter in a manner to be spaced from the lower flange 405. The upper flange 407 is also formed with cutouts 408a-408d to positionally correspond to the cutouts 406a-406d of the lower flange 405. The cutouts 408a-408d are adapted to support clamping claws 401a-401d in a manner as described hereinafter. The clamping claws 401a-401d are formed into a substantially inverted L-shape to allow the tip ends thereof to clamp a chip-type circuit element in cooperation with one another. The clamping claws each are integrally formed at the outside thereof with an outer projection as designated at 409a or 409b which is adapted to be engaged with the upper periphery of the socket 402 or, in the illustrated embodiment, the guide members 404a-404d of the socket 402 and at the inside thereof with an inner projection as indicated at 410a or 410b which is adapted to be engaged with the lower surface of the upper flange 407 of the operating rod 403. The inner projections 410a and 410b serve as a supporting point or fulcrum during the operation of the claws 401a-401d. The lower surface of the upper flange 407 against which the inner projections are abutted is formed to have an inclination between 10° and 15° so that the inner projections may be pivotally engaged with the lower surface. The clamping claws 401a-401d are positioned in the socket 402 by supporting the outer projections of the claws on the guide plates 404a-404d of the socket 402, engaging the inner projections of the claws with the upper flange 407 of the operating rod 403 and partially fitting the claws in the cutouts 408a-408d of the upper flange 407 to upward project the tip end of the claws. The clamping claws 401a-401d each are formed at the outer side portion thereof downward extending from the outer projection and received in the socket 402 with a recess of an arcuate shape indicated at 411a or 411b in FIG. 13. The recesses serve to receive a coiled spring 412 of an annular shape therein to securely support the claws 401a-401d about the operating rod 403.

Figure 16:
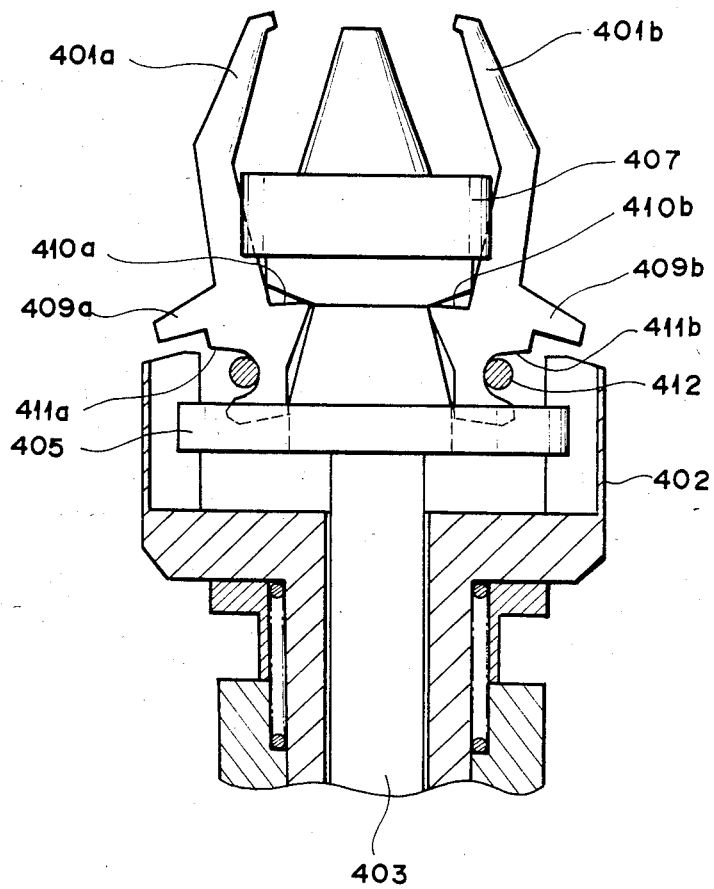
FIG. 16 is a vertical sectional view showing the clamping mechanism of FIG. 13 in an opened state.

In the clamping mechanism constructed as described above, as can be seen from FIGS. 13 to 16, when the operating rod 403 is downward retreated until the lower flange 405 is lowered to the inner bottom surface of the socket 402; the outer projections 409a and 409b of the clamping claws 401a-401d are abutted against the upper edge of the socket 402 and the coiled spring 412 is expanded about the pivotal engagement points between the inner projections 410a and 410b of the claws and the lower surface of the upper flange 407, so that the tip ends of the claws approach to each other to keep the claws at a closed state (FIG. 13). Then, when the operating rod 403 is actuated to project from the socket 402, the claws 401a-401d supported around the operating rod 403 are upward moved so that the outer projections 409a and 409b of the claws are released from the forced engagement with the upper edge of the socket 402. At this time, the expanded coiled spring 412 is contracted, so that the claws 401a-401d may be outward moved in synchronism with one another about the pivotal engagement points due to the force of the coiled spring 412 to open the tip ends thereof together (FIG. 16). This results in a circuit element being received in a space defined by the opened claws. Then, the downward movement of the operating rod 403 causes the outer projections 409a and 409b of the claws to be abutted against or engaged with the upper edge of the socket 402 placed at somewhat higher position due to the bias of a spring as described below to close the claws to securely clamp the circuit element.

Figure 17:
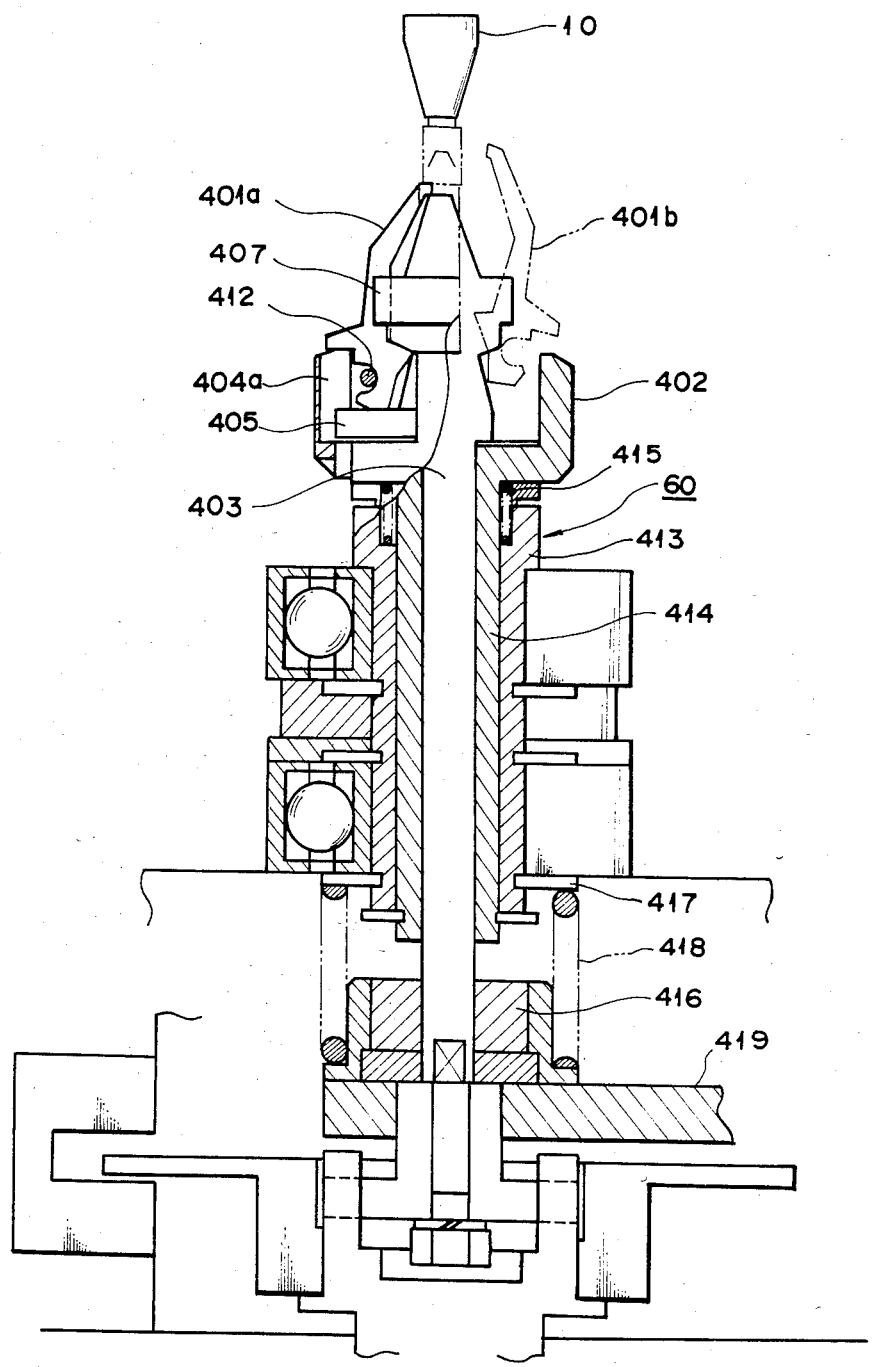
FIG. 17 is a vertical sectional view showing a circuit element turning device for a standard-type circuit element having the clamping mechanism of FIG. 13 incorporated therein.
Figure 18:
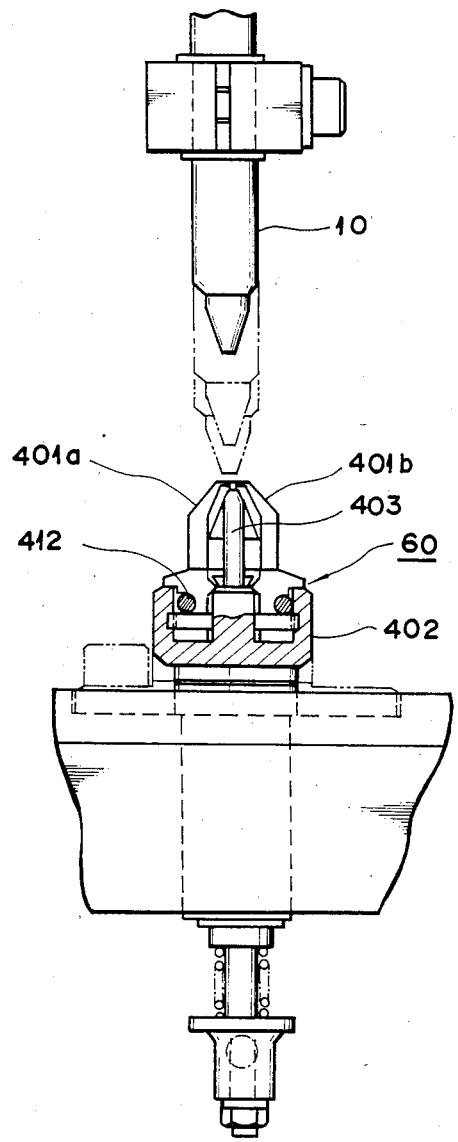
FIG. 18 is a front elevation view partly in section of the circuit element turning device shown in FIG. 17.

The clamping mechanism of such construction may be incorporated in the circuit element turning device 60 in a manner as shown in FIG. 17. In the circuit element turning device 60, the socket 402 is integrally mounted on the upper end of an inner tube 414 fittedly supported in an outer tube 413 and the operating rod 403 is inserted through the inner tube 414. The inner tube 414 is arranged to be upward biased by a compression spring 415 interposed between the inner tube 414 and the outer tube 413 so that the inner tube 414 may be somewhat upward moved with the upward movement of the operating rod 403. Also, the operating rod 403 is adapted to be downward biased due to the tension of a compression spring 418 arranged between a collar 416 mounted on the lower end of the operating rod 403 and a collar 417 of the outer tube 413. The upward movement of the operating rod 403 is carried out by upward moving a plate member 419 formed integral with the collar 416 by means of a driving cam 158 fitted on the rotating shaft 138 connected to the drive motor 133 as shown in FIG. 4A.

As described above, in the circuit element turning device 60, the operating rod 403 is upward moved when the plate member 419 provided integral with the collar 416 is upward pushed, so that the outer projections of the claws 401a-401d are disengaged from the socket 402 to contract the coiled spring 412 to open the claws, resulting in a space sufficient to receive a circuit element held on the mounting head 10 being formed. With the upward movement of the operating rod 403, the inner tube 414 is raised to a predetermined position due to the extension of the compression spring 415. Then, when a circuit element is received in the space defined at the tip ends of the claws 401a-401d, the plate member 419 is lowered to cause the operating rod 403 to be downward moved to abut the outer projections of the claws against the upper edge of the socket 402 placed at a somewhat higher position due to the action of the compression spring 415, so that the claws 401a-401d tense the coiled spring 412 to close the tip ends of the claws to clamp a circuit element. When the circuit element is clamped by the claws 401a-401d, the circuit element turning device 60 is rotated by a suitable angle by a stepping motor 420 shown in FIG. 4A to position the circuit element toward the correct direction and concurrently the claws 401a-401d are closed by the action of the coiled spring 412 to carry out the centering of the circut element.

It is a matter of course that the clamping mechanism is also applicable to the mounting head.

As can be seen from the foregoing, the clamping mechanism can synchronously operate the claws to carry out the precise clamping and centering of a circuit element.

Now, the incorporation of the clamping mechanism into the circuit element turning device 70 will be described with reference to FIGS. 19 to 24.

As described above, in the circuit element turning device 60 for a circuit element of the standard-type, the four clamping claws are arranged around the operating rod 403. However, such construction is not suitable for the circuit element turning device 70 for a special-type circuit element because the special-type circuit element is heavier than standard-type one. Thus, the clamping mechanism for the circuit element turning device 70 preferably comprises one pair of claws provided at the mounting head 10 to aid the suction of a circuit element by the nozzle tip of the mounting head and the other pair of claws provided at the circuit element turning device 70.

More particularly, the clamping mechanism comprises a pair of claws 501a and 501b mounted on the mounting head 10 so as to clamp a circuit element therebetween and the other pair of claws 502a and 502b mounted on the circuit element turning device 70. The claws 501a and 501b of the mounting head 10 are adapted to open and close when the mounting head 10 takes out a circuit element from the tape feeder 30 and mounts it on the substrate P for a printed circuit board, whereas the claws 502a and 502b provided at the direction turning device 70 act to clamp the circuit element from all quarters in cooperation with the claws 501a and 501b of the mounting head 10 during the setting of direction of the circuit element.

Figure 20:
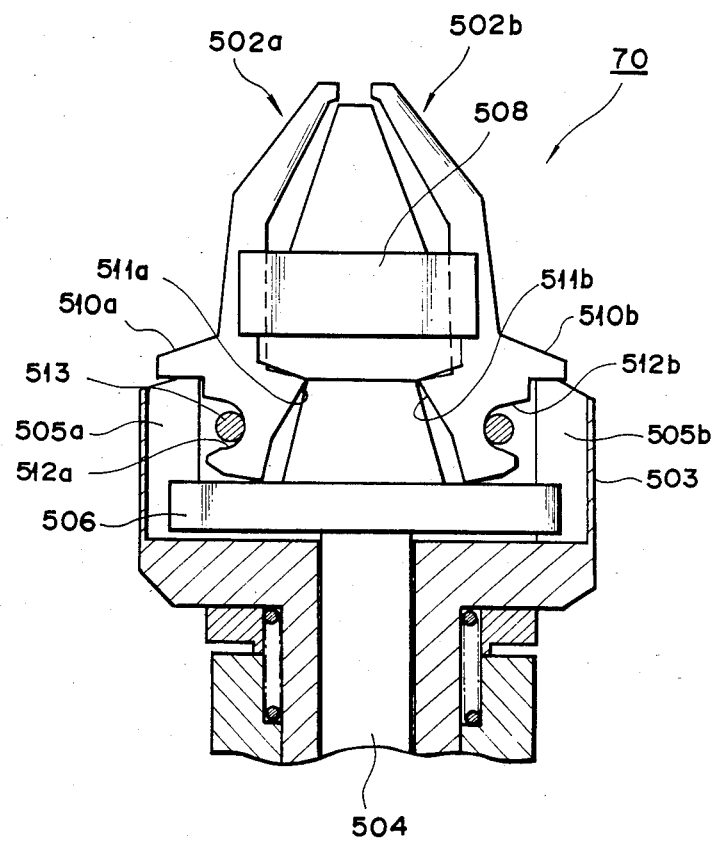
FIG. 20 is a clamping mechanism incorporated in the circuit element turning device shown in FIG. 19.

The manner of mounting of the claws 501a, 501b, 502a and 502b will be described with respect to the circuit element turning device 70 with reference to FIGS. 20 and 21.

Figure 22:
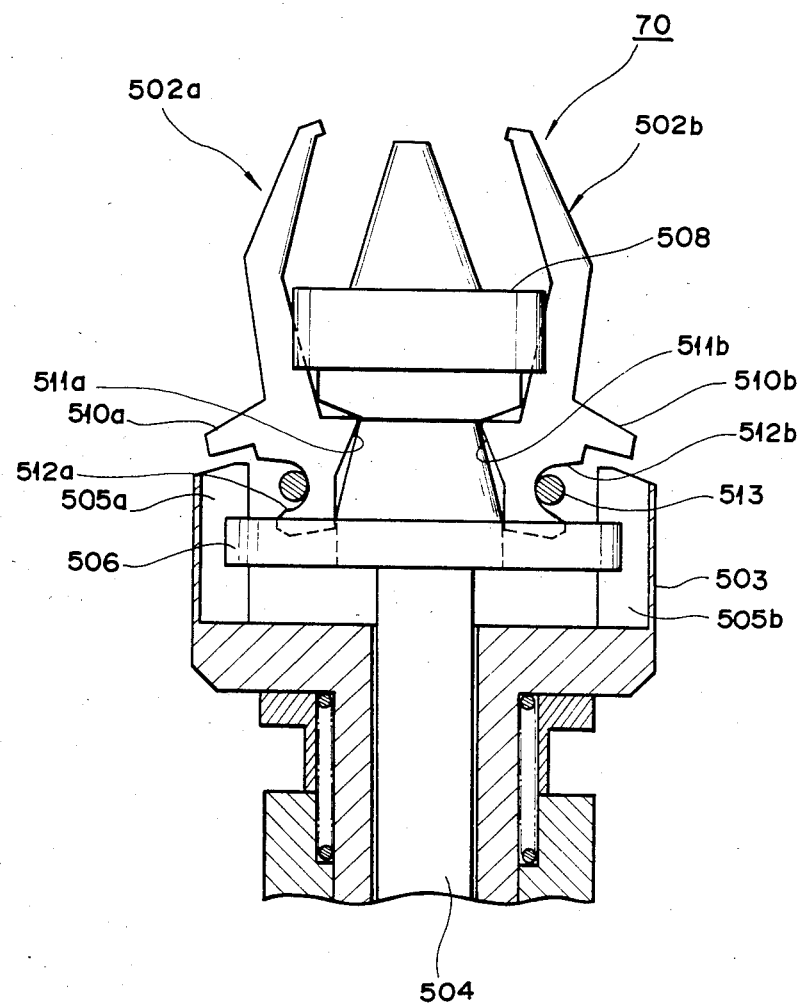
FIG. 22 is a vertical sectional view showing the clamping mechanism of FIG. 20 in an opened state.

A pair of the clamping claws 502a and 502b are arranged in a socket 503 of a concave shape about an operating rod 504 vertically movably inserted through the center of the socket 503. The socket 503 has a round plane configuration and is integrally provided at the inner periphery thereof with two rib-like guide members 505a and 505b of a given width. The guide members 505a and 505b act to guide the vertical movement of the operating rod 504. For this purpose, the guide members 505a and 505b are fitted in cutouts 507a and 507b formed at a lower flange 506 of the operating rod 504, respectively. The operating rod 504 is also provided with an upper flange 508 having a diameter smaller than the lower flange 506 and spaced therefrom. The upper flange 508 is formed with cutouts 509a and 509b at the positions corresponding to the cutouts 507a and 507b, which are adapted to partially receive the claws 502a and 502b therein, respectively. The claws 502a and 502b are formed into a substantially inverted L-shape. Also, the claws 502a and 502b are provided at the outsides thereof with outer projections 510a and 510b which are adapted to be engaged with the upper edge of the socket 503 and at the insides thereof with inner projections 511a and 511b which are adapted to be engaged with the lower surface of the upper flange 508, respectively. The inner projections 511a and 511b serve as a supporting point or fulcrum for the clamping operation of the claws. The lower surface of the upper flange 508 is outward upward inclined at an angle of 10°-15° to allow the tip end of each of the inner projections 511a and 511b to be pivotally engaged therewith. In the illustrated embodiment, the outer projections 510a and 510b of the claws 502a and 502b are engaged with the guide members 505a and 505b of the socket 503, the inner projections 511a and 511b are engaged with the lower surface of the upper flange 508 of the operating rod 504, and the claws 502a and 502b are partially fitted in the cutouts 509a and 509b of the upper flange 508; so that the tip end of each of the claws 502a and 502b may be upward projected. The claws 502a and 502b are formed at the portions of the outsides thereof received in the socket 503 with cutouts 512a and 512b of an arcuate shape which are adapted to fit an annular coiled spring 513 to allow the claws to be securely supported about the operating rod 504. In the clamping mechanism of such construction, as shown in FIGS. 20 and 22, when the operating rod 504 is in a state retreated to a level sufficient to cause the lower flange 506 to be contacted with the inner bottom surface of the socket 503, the outer projections 510a and 510b of the claws 502a and 502b are engaged with the upper edge of the socket 503 and the coiled spring 513 is expanded due to the expansion of the lower portion of the claws about the pivotal engagement point between the inner projections 511a and 511b and the lower surface of the upper flange 508, so that the claws 502a and 502b are closed at the tip ends thereof (FIG. 20). Then, the operating rod 504 is actuated to project from the socket 503, the claws 502a and 502b are upward moved with the movement of the operating rod 504, so that the outer projections 510a and 510b of the claws 502a and 502b may be released from the forced engagement with the upper edge of the socket 503. At this time, the expanded coiled spring 513 contracts to cause the claws 502a and 502b to be concurrently pivotally moved about the engagement point between the inner projections 511a and 511b and the upper flange 508 to open the tip ends of the claws, to thereby define a space sufficient to receive a circuit element therein (FIG. 22). Then, when a circuit element is received in the space, the downward movement of the operating rod 504 causes the outer projections 510a and 510b of the claws to be abutted against the upper edge of the socket 503 moved to a somewhat higher position due to the bias of a compression spring to close the tip ends of the claws to securely clamp the circuit element.

Figure 19:
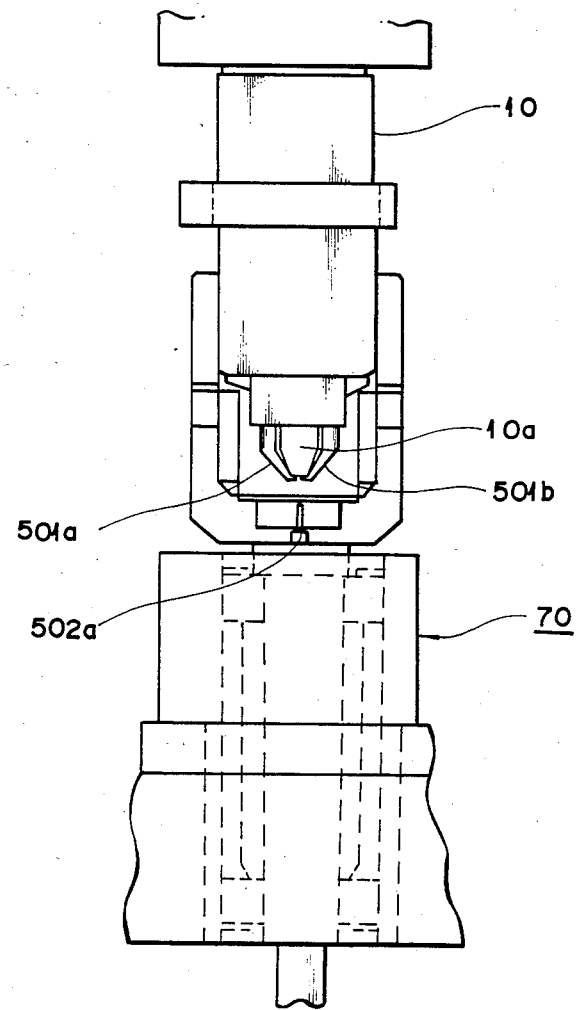
FIG. 19 is a front elevation view showing the relationship between a mounting head and a circuit element turning device for a special-type circuit element in the automatic mounting apparatus shown in FIG. 1.
Figure 23:
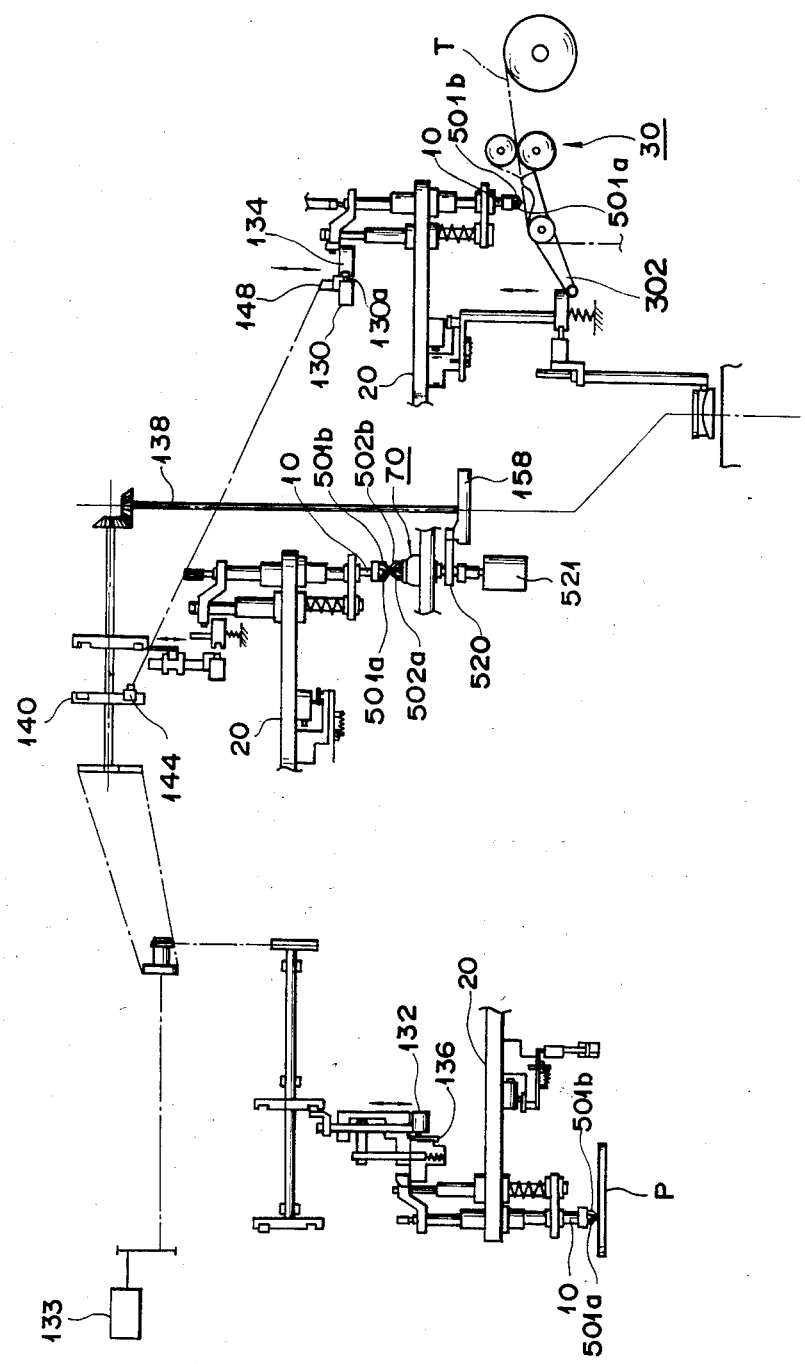
FIG. 23 is a schematic view showing the manner of operation of the mounting head and circuit element turning device of FIG. 19.

Likewise, the mounting head 10, as shown in FIG. 19, is provided with a pair of the clamping claws 501a and 501b in a manner such that the vacuum nozzle 10a of the mounting head 10 is used as an operating rod and the claws are downward arranged to downward extend from the nozzle tip of the mounting head 10. The mounting head 10, as described above, is adapted to vertically move the vacuum nozzle using the drive motor 133 as a driving source. For the purpose of sucking up a circuit element, when the hammer solenoid 130 receives an operation command to cause the solenoid pin 130a to be engaged with the engagement piece member 134, an operating shaft 148 is downward moved through the cam follower 144 engaged with the cam groove of the cam disc 140 as shown in FIG. 23 to downward move the hammer solenoid 130 fitted on the shaft 148, to thereby lower the vacuum nozzle of the mounting head 10. The lowering of the mounting head 10 allows the head 10 to take out a circuit element from the chip tape of the tape feeder 30 by suction and then the vacuum nozzle is raised along the cam groove of the cam disc 140 to the original position while holding the circuit element by a pair of the claws 501a and 501b. When the circuit element is to be mounted on a substrate P, the hammer solenoid 132 releases the holding lever 136 to lower the vacuum nozzle of the mounting head 10 and the claws 501a and 501b are opened at the tip ends thereof. These operations are carried out when the mounting head 10 is moved to a predetermined position due to the rotation of the rotating disk 20, during which the circuit element is not only sucked up on the nozzle tip of the mounting head 10 but clamped by a pair of the claws 501a and 501b, so that the clamping mechanism may effectively carry out the holding and transporting of a circuit element of the special-type substantially heavier than that of the standard-type.

Figure 24:
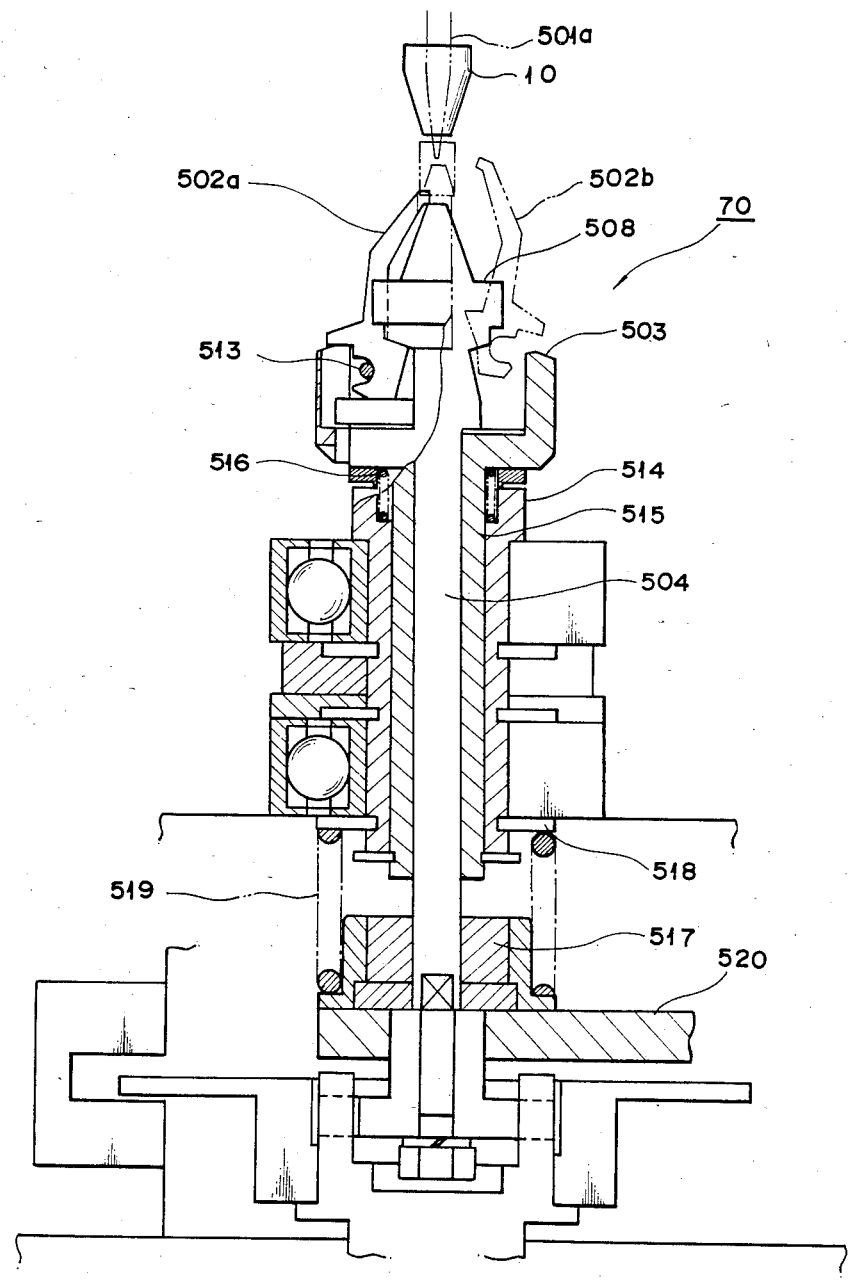
FIG. 24 is a vertical sectional view showing the circuit element turning device of FIG. 19.

Further, in the circuit element turning device 70, as shown in FIG. 24, the socket 503 is integrally mounted on the upper portion of an inner tube 515 fittedly inserted in an outer tube 514 and the operating rod 504 is inserted through the inner tube 515. The inner tube 515 is adapted to be upward biased by a compression spring 516 arranged between the outer tube 514 and the inner tube 515 so that it may be somewhat upward moved with the raising of the operating rod 504. Also, the circuit element turning device 70 includes a compression spring 519 arranged between a collar 517 mounted on the lower end of the operating rod 504 and a collar 518 provided at the lower end of the outer tube 514 and a plate member 520 formed integral with the collar 517 and downward biased by the compression spring 519. The plate member 520 is upward moved by the cam 158 fitted on the rotating shaft 138 connected to the drive motor 133, so that the operating rod 504 may be upward moved. This causes the outer projections 510a and 510b of the claws 502a and 502b to be disengaged from the upper edge of the socket 503, resulting in the upper ends of the claws being opened due to the contraction of the coiled spring 513 to form a space sufficient to receive a circuit element held on the mounting head 10 therein. With the upward movement of the operating rod 504, the inner tube 515 is raised to a predetermined level by the expansion of the compression spring 516. Then, when a circuit element is received between the opened tip ends of the claws 502a and 502b, the operating rod 504 is downward moved due to the lowering of the plate member 520 to abut the outer projections 510a and 510b of the claws 502a and 502b against the upper edge of the socket 503 held at a somewhat higher position due to the force of the compression spring 516, so that the claws 502a and 502b may expand the coiled spring 513 to permit the tip ends of the claws to clamp the circuit element together. Thus, the claws 502a and 502b securely hold the circuit element from all quarters in cooperation with the claws 501a and 501b. Further, the rotation of the circuit element turning device 70 by a suitable angle together with the mounting head 10 by means of a stepping motor 521 causes the correct positioning and centering of the circuit element. The direction turning may be carried out in a manner such that the mounting head 10 is downward moved to open the claws 501a and 501b to allow only the claws 502a and 502b of the circuit element turning device 70 to clamp the circuit element held on the nozzle tip of the mounting head 10 by suction. This does not cause any problem because the mounting head 10 is adapted to clamp the circuit element during the upward movement.

Furthermore, in the illustrated embodiment, as described above, when the discharge device 110 is to discharge a special-type circuit element of wrong posture clamped by the mounting head having the above-mentioned clamping mechanism, the suction release pin device 120 is actuated to remove the circuit element of wrong posture from the mounting head 10. Thus, the release pin 120 is supposed to abut against the claws 501a and 501b for clamping the circuit element of wrong posture together to prevent the removal of the element from the mounting head 10. In order to avoid such trouble, the direction return device 100 is provided to return a circuit element clamped by the claws 501a and 501b to the direction in which the actuation of the suction release pin 120 is not prevented or the direction in which the circuit element has been sucked up from the tape feeder 30, and for this purpose, the direction return device 100 is provided with a pair of claws in a manner as in the circuit element turning device 70.

As can be seen from the foregoing, in the clamping mechanism employed in the circuit element turning device 70, the respective pairs of the claws are provided at the mounting head 10 and the circuit element turning device 70 to be operated in synchronism with each other, so that the transporting and direction turning of a circuit element of the special-type heavier than that of the standard-type may be effectively accomplished.

The construction of the illustrated embodiment described above allows the automatic mounting operation of chip-type circuit element to be efficiently and precisely accomplished according to a random access system in addition to a sequence acess system.

Thus, it will be noted that the automatic mounting apparatus of the present invention can effectively cope with the suction failure and wrong posture to smoothly and positively carry out the mounting of various types of circuit elements on a substrate for a printed circuit board.

It will thus be seen that the objects set forth above, among those made apparent from the preceding description, are efficiently attained and, since certain changes may be made in the above construction without departing from the spirit and scope of the invention, it is intended that all matter contained in the above description as shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. An automatic mounting apparatus comprising:
    a rotating disk;
    a plurality of mounting heads arranged on the surface of said rotating disk at regular intervals to downward direct nozzle tips thereof;
    a plurality of tape feeders for feeding chip tapes which hold chip-type circuit elements thereon, said tape feeders being radially arranged toward the axis of rotation of said rotating disk below the passage of movement of said mounting heads;
    an X-Y table for carrying thereon a substrate on which the circuit elements are to be mounted, said X-Y table being arranged opposite to said tape feeders;
    said mounting heads successively sucking up chip-type circuit elements from said chip tapes and mount said circuit elements on said substrate with the rotation of said rotating disk; and
    detecting means for detecting a defect of the circuit element such as a failure in suction of a circuit element by the mounting head, the wrong posture of a circuit element sucked up on the mounting head or the like;
    said rotating disk being controllably actuated to allow the mounting head other than the mounting head relating to said defect to suck up a circuit element of the same kind from said tape feeders and mount it on said substrate after said detecting means detects said defect.

2. An automatic mounting apparatus as defined in claim 1 further comprising a driving force transmission mechanism including hammer solenoid means having a solenoid pin projected when said hammer solenoid is actuated in response to an electrical command, said hammer solenoid means being arranged between a driving source and a driven mechanism of said automatic mounting apparatus to transmit power of said driving source through said solenoid pin of said hammer solenoid to said driven mechanism.

3. An automatic mounting apparatus as defined in claim 1, wherein said tape feeders each comprises:
    a chip tape feed drum;
    a cam lever for intermittently rotating said chip tape feed drum;

a follower roll arranged to be abutted at the peripheral surface thereof against the cam edge of said cam lever; and a reel for winding up a cover tape of said chip tape which is arranged to be contacted with said follower roll;

said cam lever being pivotally moved to intermittently rotate said chip tape feed drum to feed said chip tape one pitch at a time and rotate said follower roll by a predetermined angle to peel said cover tape from said chip tape by said reel rotated while being contacted with said follower roll.

4. An automatic mounting apparatus as defined in claim 3, wherein said reel is mounted to be vertically biased with the rotation of said follower roll.

5. An automatic mounting apparatus as defined in claim 1, wherein said tape feeders are arranged on a movable carriage which is detachably connected to a body of said automatic mounting apparatus.

6. An automatic mounting apparatus as defined in claim 5, wherein said carriage includes a tape receiving box for receiving therein an empty tape discharged from each of said tape feeders.

7. An automatic mounting apparatus as defined in claim 5, wherein said carriage comprises a tape receiving box for receiving therein an empty tape discharged from each of said tape feeders and caster means for supporting said tape receiving box in a manner to be inclinable by means of a link plate.

8. An automatic mounting apparatus as defined in claim 1 further comprising a circuit element clamping mechanism comprising:

a socket formed into a concave shape;

a plurality of clamping claws supported in said socket, said clamping claws each having an outer projection engaged with the upper edge of said socket and an inner projection pivotally engaged with an operating rod vertically movably inserted through the central portion of said socket;

said clamping claws being arranged about said operating rod in said socket and projecting at the tip ends thereof from said socket; and a coiled spring of an annular shape disposed to elastically surround the portions of said clamping claws received in said socket to securely hold said claws with respect to said operating rod;

said clamping claws being openably operated at the tip ends thereof about said inner projections pivotally engaged with said operating rod due to the bias of said coiled spring with the vertically movement of said operating rod.

9. An automatic mounting apparatus as defined in claim 1 further comprising a circuit element turning device for correcting the wrong posture of a circuit element held on said nozzle tip of said mounting head by suction;

said mounting heads being provided with a pair of clamping claws for clamping a circuit element held on said nozzle tip of said mounting head by suction;

said circuit element turning device being provided with a pair of clamping claws for clamping said circuit element from all quarters in cooperation with said clamping claws of said mounting head.

* * * * *